US010012534B2

(12) United States Patent
Andreou et al.

(10) Patent No.: US 10,012,534 B2
(45) Date of Patent: Jul. 3, 2018

(54) PHOTODETECTION CIRCUIT HAVING AT LEAST ONE COUNTER OPERATIVE IN RESPONSE TO A MODE SWITCHING CIRCUIT AND OPERATING METHOD THEREOF

(71) Applicant: The Johns Hopkins University, Baltimore, MD (US)

(72) Inventors: Andreas G. Andreou, Baltimore, MD (US); Joseph H. Lin, Arlington, MA (US); Philippe O. Pouliquen, Baltimore, MD (US); Charbel G. Rizk, Sykesville, MD (US)

(73) Assignee: The Johns Hopkins University, Baltimore, MD (US)

( * ) Notice: Subject to any disclaimer, the term of this patent is extended or adjusted under 35 U.S.C. 154(b) by 72 days.

(21) Appl. No.: 15/318,373

(22) PCT Filed: Jul. 2, 2014

(86) PCT No.: PCT/US2014/045178
§ 371 (c)(1),
(2) Date: Dec. 13, 2016

(87) PCT Pub. No.: WO2016/003451
PCT Pub. Date: Jan. 7, 2016

(65) Prior Publication Data
US 2017/0131143 A1    May 11, 2017

(51) Int. Cl.
*G01J 1/44*    (2006.01)
*H01L 31/02*    (2006.01)
(Continued)

(52) U.S. Cl.
CPC .......... *G01J 1/44* (2013.01); *H01L 31/02027* (2013.01); *H01L 31/035272* (2013.01);
(Continued)

(58) Field of Classification Search
CPC ................ G01J 2001/4466; G01J 1/44; G01J 2001/442; H01L 31/02027; H01L 31/107
(Continued)

(56) References Cited

U.S. PATENT DOCUMENTS 5,933,042 A    8/1999   Trottier et al.
7,605,357 B2 * 10/2009  Fathimulla ............ H01L 31/107
                                           250/214 R
(Continued)

FOREIGN PATENT DOCUMENTS

EP     1674873 A2     8/2006
WO   2004/054235 A1   6/2004
WO   2007/032006 A2   3/2007

OTHER PUBLICATIONS

European Patent Office, Supplemental Partial European Search Report, Appl. No. EP 14 89 6574, dated Feb. 16, 2018, pp. 1-11.
(Continued)

*Primary Examiner* — Que T Le
(74) *Attorney, Agent, or Firm* — Noah J. Hayward

(57) ABSTRACT

A photodetection circuit includes an avalanche photodiode and a mode switching circuit that may be configured to selectively switch an operating mode of the photodetection circuit between linear mode and Geiger mode. The photodetection circuit may further include a quenching circuit configured to quench and reset the avalanche photodiode in response to an avalanche event when the photodetection circuit is operated in Geiger mode. The photodetection circuit may additionally include an integration circuit configured to integrate photocurrent output by the photodiode and generate integrated charge units when the photodetection circuit is operated in linear mode. The photodetection circuit may also include a counter configured to count pulses output by the avalanche photodiode when the photodetection circuit is operated in Geiger mode and to count integrated
(Continued)

charge units generated by the integration circuit when the photodetection circuit is operated in linear mode.

21 Claims, 12 Drawing Sheets

(51) Int. Cl.
    *H01L 31/107*     (2006.01)
    *H01L 31/0352*     (2006.01)

(52) U.S. Cl.
    CPC ...... *H01L 31/107* (2013.01); *G01J 2001/442* (2013.01); *G01J 2001/4406* (2013.01); *G01J 2001/448* (2013.01); *G01J 2001/4466* (2013.01)

(58) Field of Classification Search
    USPC .............................. 250/214 R, 214.1, 208.1
    See application file for complete search history.

(56) References Cited

U.S. PATENT DOCUMENTS

| | | |
|---|---|---|
| 8,093,624 B1 | 1/2012 | Renzi et al. |
| 8,446,503 B1 | 5/2013 | Koenck et al. |
| 2006/0124832 A1 | 6/2006 | Harmon et al. |
| 2008/0217521 A1 | 9/2008 | Forsyth |
| 2008/0240341 A1 | 10/2008 | Possin et al. |
| 2011/0127415 A1 | 6/2011 | Kanter |
| 2011/0240865 A1 | 10/2011 | Frach et al. |
| 2012/0075615 A1 | 3/2012 | Niclass et al. |
| 2012/0205522 A1 | 8/2012 | Richardson et al. |
| 2013/0112848 A1 | 5/2013 | Lin et al. |

OTHER PUBLICATIONS

International Search Authority, Written Opinion and Search Report, PCT/US2014/045178, dated Nov. 19, 2014, pp. 1-10.

\* cited by examiner

PHOTODETECTION CIRCUIT HAVING AT LEAST ONE COUNTER OPERATIVE IN RESPONSE TO A MODE SWITCHING CIRCUIT AND OPERATING METHOD THEREOF

FIELD OF THE DISCLOSURE

Aspects of the present disclosure relate generally to photodetection technology and, more particularly, to a photodetection circuit capable of being selectively operated in either Geiger mode or linear mode and a method for operating the photodetection circuit.

BACKGROUND

The dynamic range of the human eye is capable of a remarkable ten orders of magnitude—from near darkness to bright sunlight. The sensitivity of the human eye can largely be attributed to the division of photoreceptors in the retina between rod cells, which are capable of responding to a single photon of light, and less sensitive cone cells. Both rod and cone cells are capable of dynamically altering their sensitivity, thus further enhancing the range of sensitivity of the human eye.

The retina of the human eye is also exemplary for the combination of phototransduction and signal processing at the focal plane. The retina is organized in a three-dimensional structure (3D) with separate layers for phototransduction and signal processing. Biological retinas efficiently use limited bandwidth by only encoding salient features and digitally transmitting through a spike-based code. This 3D retinal structure allows for maximization of the area for phototransduction (e.g., fill-factor) while having area left over to perform low level signal processing.

Work is ongoing to develop sensors for use in digital devices such as digital cameras that have the sensitivity range of the human eye. For example, recent advances in semiconductor technology have allowed the manufacture of sensors that approach the dynamic range of the human eye. In particular, avalanche photodiodes (APD), which are the solid state equivalent of photoreceptor cells found in the human eye, have been fabricated using techniques similar to those used to fabricate commercial chips. However, while solid state sensors, such as APDs, which are capable of approximating the dynamic range of the human eye have been developed, there is still a need to develop a circuit for dynamically operating an APD and/or an array of APDs in a manner that mimics the human eye's ability to dynamically adjust operation mode to a wide dynamic range of light conditions.

SUMMARY

Embodiments disclosed herein provide a photodetection circuit capable of being selectively operated in either Geiger mode or linear mode and an associated method for operating a photodetection circuit. In this regard, some example embodiments provide a photodetection circuit that may be dynamically operated to provide for wide dynamic range sensing in a variety of lighting conditions, thus approximating the dynamic range of the human eye. The photodetection circuit of some example embodiments may be implemented as an eye System on Chip (eye SOC), which may implement functional computational structures in mixed-domain circuits and representations for adaptive, wide dynamic range sensing.

The photodetection circuit of some example embodiments includes one or more avalanche photodiodes, which may be used for photodetection. The photodetection circuit of such example embodiments may be operated to achieve dynamic range similar to the human eye by dynamically biasing an avalanche photodiode in linear mode or Geiger mode.

The photodetection circuit of some example embodiments has a tiered structure providing an increased pixel fill factor. More particularly, the photodetection circuit of some example embodiments may include a first tier (e.g., a sensing tier) including one or more avalanche photodiodes. A second tier (e.g., a processing tier) including one or more signal processing circuits may be implemented underling the first tier. In this regard, by separating the avalanche photodiode(s) and signal processing circuit(s) into two different layers, a greater usage of a surface area of the photodetection circuit of such example embodiments may be used to implement light sensing pixels. The photodetection circuit of such example embodiments may be used to develop image sensors, such as charge coupled devices (CCDs), having an increased resolution compared to existing image sensors due to the increased pixel fill factor provided by the tiered structure.

The tiered photodetection circuit of some example embodiments may be implemented through use of a 3D complementary metal-oxide-semiconductor (CMOS) structure. In this regard, 3D CMOS integration may be used in some example embodiments to allow signal processing circuit(s) to reside underneath the avalanche photodiode(s), which allows for a maximum pixel fill factor Some such example embodiments use through silicon vias (TSVs) to enable stacking wafers with CMOS circuitry to implement a tiered photodetection circuit.

A photodetection circuit in accordance with some example embodiments may include an avalanche photodiode. The photodetection circuit may further include a mode switching circuit that may be configured to selectively switch an operating mode of the photodetection circuit between linear mode and Geiger mode by modifying a bias voltage applied to the avalanche photodiode during operation of the photodetection circuit. The photodetection circuit may further include a quenching circuit configured to quench and reset the avalanche photodiode in response to an avalanche event when the photodetection circuit is operated in Geiger mode. The photodetection circuit may additionally include an integration circuit configured to integrate photocurrent output by the photodiode and generate integrated charge units based at least in part on the integrated photocurrent when the photodetection circuit is operated in linear mode. The photodetection circuit may also include at least one counter. The at least one counter may be configured to count pulses output by the avalanche photodiode when the photodetection circuit is operated in Geiger mode and to count integrated charge units generated by the integration circuit when the photodetection circuit is operated in linear mode.

Some example embodiments provide a method of operating a photodetection circuit configured to selectively operate in either linear mode or Geiger mode. The method may include operating the photodetection circuit in one of linear mode or Geiger mode. The method may further include reading a counter value generated based at least in part on an amount of light detected by the photodetection circuit and determining if the counter value has exceeded a defined threshold value. If it is determined that the counter value has exceeded the defined threshold value and the photodetection circuit is being operated in Geiger mode, the method may additionally include switching from Geiger mode to linear mode. If it is determined that the counter value has exceeded the defined threshold value and the photodetection circuit is being operated in linear mode, the method may additionally include adjusting an operating parameter of an integration circuit that may be used to integrate photocurrent.

This Summary is provided merely for purposes of summarizing some example embodiments so as to provide a basic understanding of some aspects of the disclosure. Accordingly, it will be appreciated that the above described example embodiments are merely examples and should not be construed to narrow the scope or spirit of the disclosure in any way. Other embodiments, aspects, and advantages will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompany drawings. These drawings are not necessarily drawn to scale, and in no way limit any changes in form and detail that may be made to the described embodiments by one skilled in the art without departing from the spirit and scope of the described embodiments.

DETAILED DESCRIPTION

The present disclosure now will be described more fully hereinafter with reference to the accompanying drawings, in which some, but not all aspects of the disclosure are shown. Indeed, the disclosure may be embodied in many different forms and should not be construed as limited to the aspects set forth herein; rather, these aspects are provided so that this disclosure will satisfy applicable legal requirements. Like numbers refer to like elements throughout.

It should be understood that although the terms first, second, etc. may be used herein to describe various steps, calculations or elements, these steps, calculations, or elements should not be limited by these terms. These terms are only used to distinguish one step, calculation, or element from another. For example, a first calculation could be termed a second calculation; a second step could be termed a first step; and a first element could be termed a second element, without departing from the scope of this disclosure.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

Figure 1:
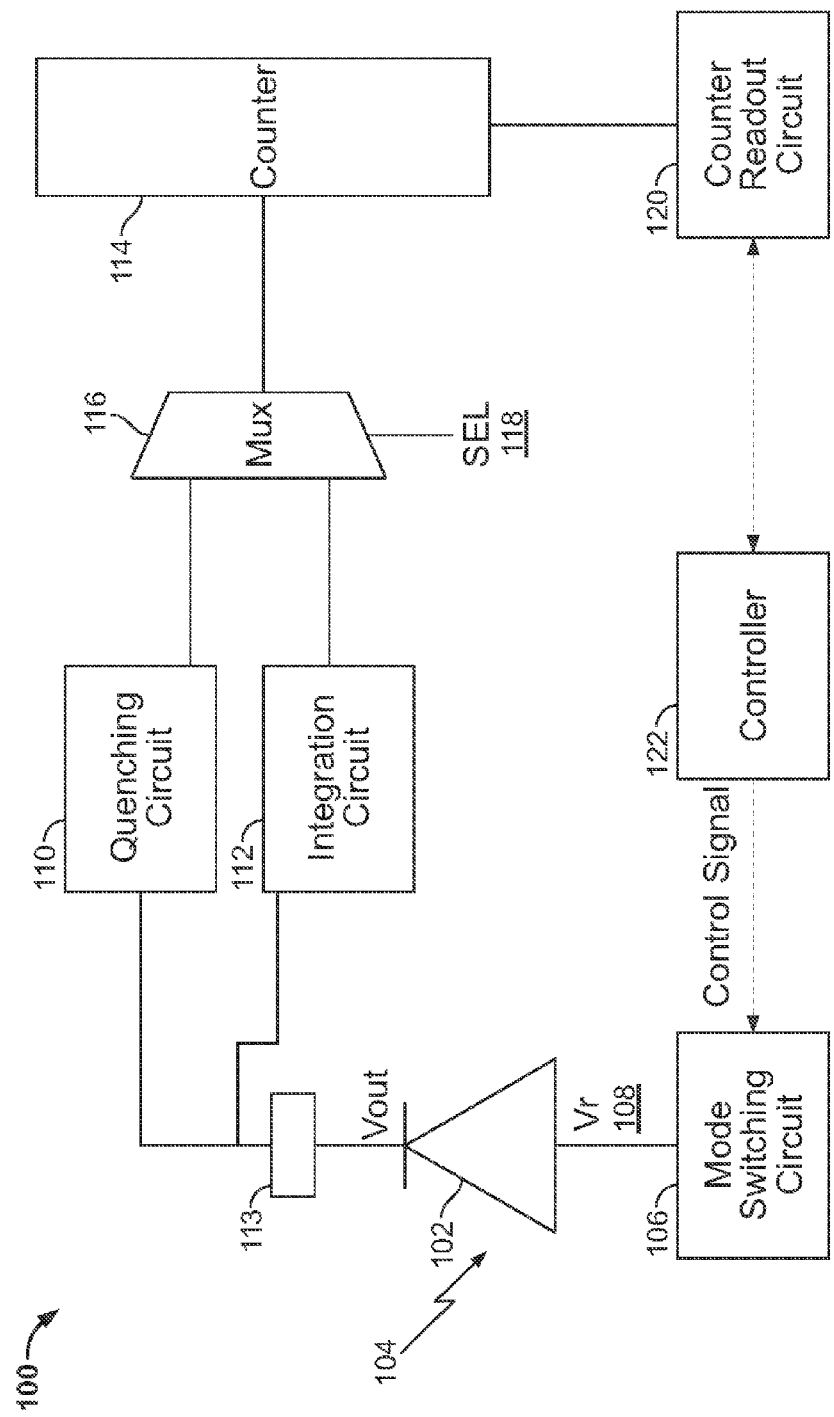
FIG. 1 illustrates a block diagram of a high level architecture of a photodetection circuit in accordance with some example embodiments.

FIG. 1 illustrates a block diagram of a high level architecture of a photodetection circuit 100 in accordance with some example embodiments. The photodetection circuit 100 may, for example, be used within an image sensor, such as a CCD or the like, that may be used in a camera device configured to capture images, such as, by way of non-limiting example, a digital camera, digital camcorder, camera phone, and/or the like. In this regard, when implemented in a camera device, the photodetection circuit 100 may be configured to sense at least a portion of an image for capture by the camera device.

It will be appreciated that elements illustrated in and described with respect to FIG. 1 below may not be mandatory and thus one or more elements illustrated in and described with respect to FIG. 1 may be omitted in certain embodiments. Additionally, some embodiments may include further or different elements beyond those illustrated in and described with respect to FIG. 1.

In some example embodiments, the elements of the photodetection circuit 100 may be implemented on the same chip. For example, in some example embodiments, the elements of the photodetection circuit 100 may be implemented on a single chip including one or more tiers, which may, for example, be manufactured using CMOS circuitry. Alternatively, in some example embodiments, the elements of the photodetection circuit 100 may be distributed across multiple physical chips, which may be coupled with each other to form the photodetection circuit 100.

The photodetection circuit 100 may include an avalanche photodiode 102. The avalanche photodiode 102 may be embodied as any type of avalanche photodiode, which can sense and convert light 104 into current and/or voltage and which may be operated in either a Geiger mode or a linear mode depending on a bias voltage applied to the avalanche photodiode 102. In some example embodiments, the avalanche photodiode 102 may be an avalanche photodiode implemented using CMOS circuitry. It will be appreciated, however, that techniques other than CMOS that may be used for manufacturing circuitry may be used in combination with or in lieu of CMOS for implementing the avalanche photodiode 102 of some example embodiments.

Figure 2:
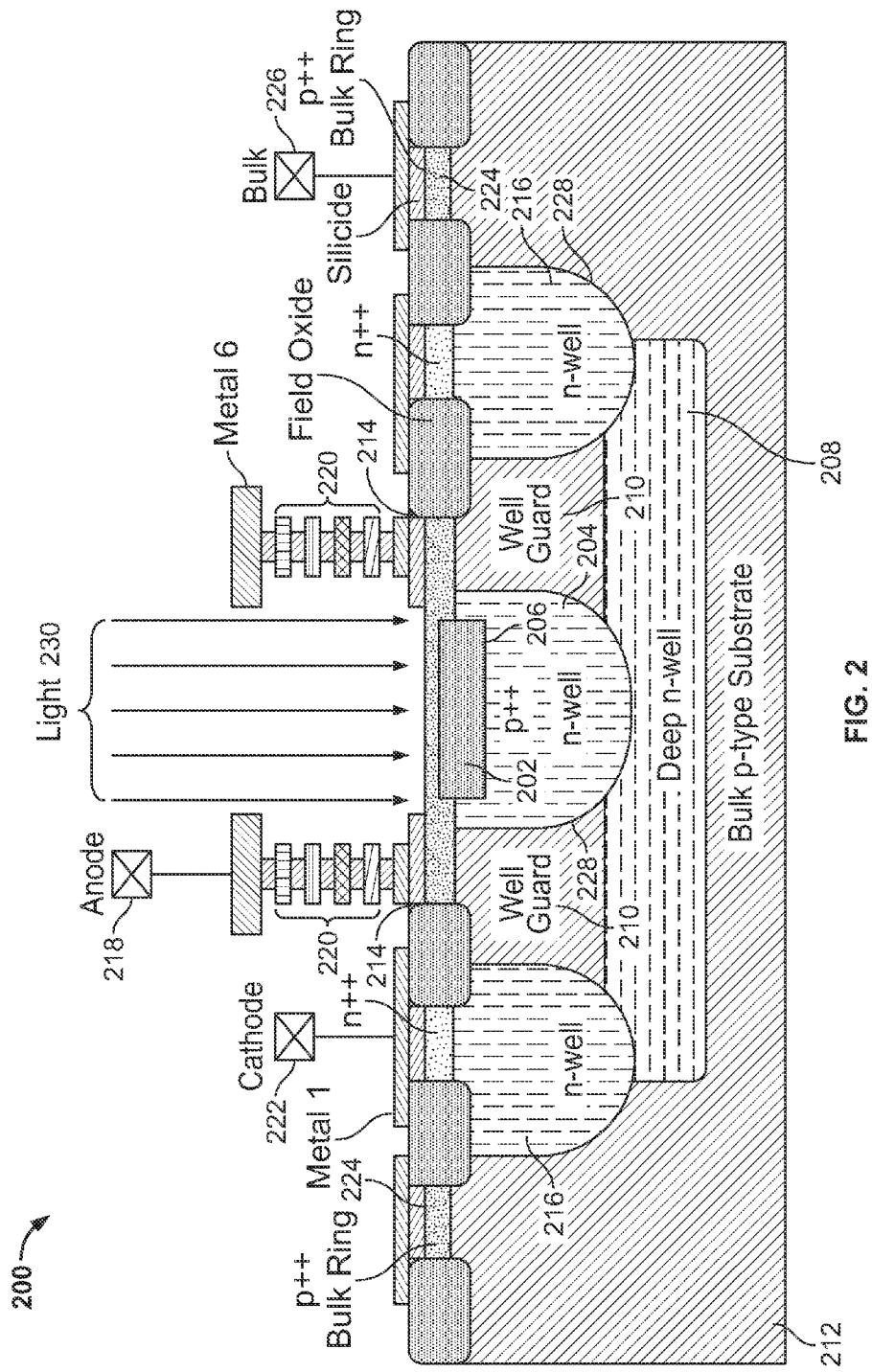
FIG. 2 illustrates a cross section of an example avalanche photodiode that may be used in a photodetection circuit in accordance with some example embodiments.
Figure 3:
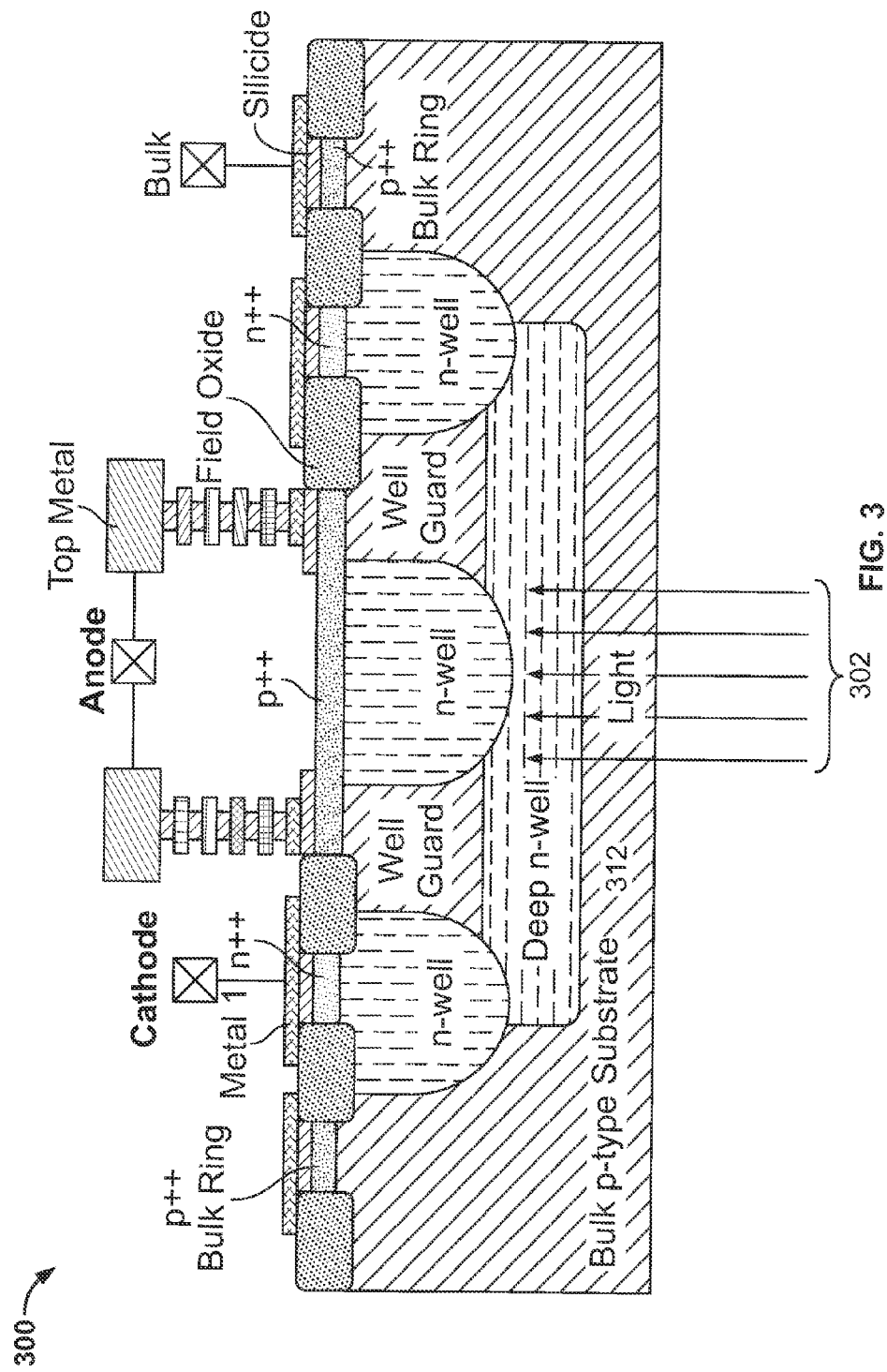
FIG. 3 illustrates a cross section of another example avalanche photodiode that may be used in a photodetection circuit in accordance with some example embodiments.

The avalanche photodiode 102 of some example embodiments may include a PN junction that may be formed via a junction between a deep N-well module and a P+-implant and/or between a deep N-well module and a P-substrate. The usage of a deep N-well module in such example embodiments may enable the implementation of a guard ring around the PN junction to prevent premature breakdown of the PN junction and provide better avalanche multiplication when the photodetection circuit 100 is operated in Geiger mode. FIGS. 2 and 3, described herein below, illustrate non-limiting example embodiments of avalanche photodiodes having a deep N-well module and guard ring that may be used to implement the avalanche photodiode 102 within the scope of the disclosure.

The avalanche photodiode 102 may have an associated breakdown voltage. When a bias voltage less than the breakdown voltage is applied to the avalanche photodiode 102 (e.g., to a PN junction of the avalanche photodiode 102), the photodetection circuit 100 may be operated in linear mode. In linear mode, the avalanche photodiode 102 may generate photocurrent in response to sensed light 104. As described further below, photocurrent that may be generated by the avalanche photodiode 102 when the photodetection circuit 100 is operated in linear mode may be sensed and integrated by the integration circuit 112.

When a bias voltage exceeding the breakdown voltage is applied to the avalanche photodiode 102 (e.g., to a PN junction of the avalanche photodiode 102), the photodetection circuit 100 may be operated in Geiger mode. When operated in Geiger mode, the avalanche photodiode 102 may be referred to as a single photon avalanche diode (SPAD). In Geiger mode, the avalanche photodiode 102 may generate a pulse in response to a single photon impact event. In this regard, when the photodetection circuit 100 is operated in Geiger mode, the electric field resulting from applying a bias voltage exceeding the breakdown voltage to the avalanche photodiode 102 may be strong enough such that a free electron-hole pairs generated within the depletion region may gain sufficient kinetic energy to free one or more additional electron-hole pairs upon impact. This process is called "impact ionization," and when it is initiated by a photon, the resulting current pulse can be sensed by a counting circuit, such as the counter 114. The impact ionization process and resulting current may be referred to as an "avalanche event." Impact ionization can also be triggered by thermally generated carriers. The mean value of these current pulses is called the "dark count rate." The dark count rate may have a Poisson distribution, and may be the primary noise source affecting the signal-to-noise ratio (SNR) of the photodetection circuit. Current pulses may also be generated from after-pulsing, where local defects in the depletion layer trap carriers during avalanche. These trapped carriers may be released in an indeterminate time, and spurious pulses may be generated when the release of a trapped carrier coincides with the reverse bias going above breakdown.

In some example embodiments, the photodetection circuit 100 may be operated in a time-of-flight measurement mode. The photodetection circuit 100 of some such example embodiments may be operated in time-of-flight measurement mode when the avalanche photodiode 102 is biased above the breakdown voltage in Geiger-mode and an external light source is present. The external light source may illuminate an object to be imaged, and the flight time of the photons from light source to reflecting off the object and being detected by the avalanche photodiode 102 may be measured. The measurement may be performed with time conversion circuitry 113, such as, a time-to-digital converter 113 or time-to-analog converter 113. In embodiments implementing a time-of-flight measurement mode, the time conversion circuitry 113 may be included in the photodetection circuit 100 and may be electrically coupled with the avalanche photodiode 102 to receive output from the avalanche photodiode 102.

The photodetection circuit 100 may further include mode switching circuit 106, which may be configured to selectively switch between operating modes of the photodetection circuit 100 by adjusting a level of a bias voltage that may be applied to the avalanche photodiode 102 (e.g., to a PN junction of the avalanche photodiode 102). The mode switching circuit 106 may be embodied as any circuitry that may be configured to control the level of the bias voltage. Thus, for example, the mode switching circuit 106 may be configured to apply a bias voltage exceeding the breakdown voltage associated with the avalanche photodiode 102 to operate the photodetection circuit 100 in Geiger mode. In order to operate the photodetection circuit 100 in linear mode, the mode switching circuit 106 may apply a bias voltage that is less than the breakdown voltage associated with the avalanche photodiode 102.

In some example embodiments, the mode switching circuit 106 may be configured to control the level of the bias voltage by controlling the level of a voltage Vr 108 that may be applied to the anode of the avalanche photodiode 102. In this regard, the mode switching circuit 106 of some example embodiments may be configured to control the level of the voltage Vr 108 so as to adjust the bias voltage between a level below the breakdown voltage associated with the avalanche photodiode 102 and a level exceeding the breakdown voltage associated with the avalanche photodiode 102. Accordingly, by controlling the voltage Vr 108, the mode switching circuit 106 of such example embodiments may be configured to selectively switch the operating mode of the photodetection circuit 100 between linear mode and Geiger mode.

In some example embodiments, the mode switching circuit 106 may be at least partially implemented using CMOS circuitry. It will be appreciated, however, that techniques other than CMOS that may be used for manufacturing circuitry may be used in combination with or in lieu of CMOS for implementing the mode switching circuit 106 of some example embodiments.

The photodetection circuit 100 may further include a quenching circuit 110. The quenching circuit 110 may be coupled with the avalanche photodiode 102, and may be configured to quench and reset the avalanche photodiode 102 in response to an avalanche event when the photodetection circuit 100 is operated in Geiger mode. In this regard, impact ionization that may occur when the photodetection circuit 100 is operated in Geiger mode can lead to an exponentially increasing current that can damage the avalanche photodiode 102 if not quenched. Additionally, as the impact ionization process is self-sustaining, the avalanche photodiode 102 must be reset before it can detect another photon in Geiger mode. When the avalanche photodiode 102 is operating as a SPAD in Geiger mode, the avalanche photodiode 102 may be quenched when the reverse bias is lowered below the breakdown voltage. The quenching circuit 110 may accordingly be implemented as any circuit which may be configured to passively and/or actively lower the reverse bias below the breakdown voltage so as to quench and reset the avalanche photodiode 102 in response to an avalanche event occurring following a photon impact detected by the avalanche photodiode 102 in Geiger mode.

In some example embodiments, the quenching circuit 110 may include a passive quenching circuit. A passive quenching circuit may be embodied as any circuit which is configured to enable the avalanche photodiode 102 to quench itself by setting Vr 108 to a negative voltage such that the difference between an output voltage of the avalanche photodiode 102 (Vout) and Vr is greater than the breakdown voltage. In this regard, during an avalanche event, the reverse current through the avalanche photodiode 102 discharges Vout, which brings the bias voltage below breakdown. Thus, the quenching circuit 110 may be configured in some example embodiments to recharge the Vout node of the avalanche photodiode 102 so that the bias voltage exceeds the breakdown voltage in response to an avalanche event. By way of non-limiting example, in some embodiments in which the quenching circuit 110 includes a passive quenching circuit, the quenching circuit 110 may include a quenching element, such as, by way of non-limiting example, a resistor, such as a high-resistance-polysilicon resistor; a thick oxide P-type metal-oxide-semiconductor (PMOS) transistor; or a high-voltage, high-drain resistance PMOS transistor that can tolerate voltage swings greater than the bias voltage, which may be configured to passively recharge the Vout node above the breakdown voltage in response to an avalanche event. As a more particular example, in some embodiments in which the quenching circuit 110 includes a passive quenching circuit, the quenching circuit 110 may include a resistor positioned such that as the voltage of the Vout node lowers during an avalanche event, a potential difference is created across the resistor, which serves to passively recharge the Vout node above the breakdown voltage. A non-limiting example of a passive quenching circuit that may be included in the quenching circuit 110 of some example embodiments is illustrated in and described below with respect to FIG. 4A.

The quenching circuit 110 of some example embodiments may include an active quenching circuit in addition to or in lieu of a passive quenching circuit. An active quenching circuit in accordance with some example embodiments may be configured to sense the onset of an avalanche pulse and lower the reverse bias voltage in response to the avalanche pulse. After a delay period that may vary in length depending on implementation (e.g., a delay period suitable for a particular implementation of the photodetection circuit 100), the active quenching circuit may be configured to reset the avalanche photodiode 102 by raising the bias voltage above the breakdown voltage. In some example embodiments in which CMOS integration may be used to implement the quenching circuit 110, the delay period may be on the order of a minimum of hundreds of picoseconds. It will be appreciated, however, that the delay period may vary depending on the implementation of the quenching circuit. A non-limiting example of an active quenching circuit that may be included in the quenching circuit 110 of some example embodiments is illustrated in and described below with respect to FIG. 5A.

In some example embodiments, the quenching circuit 110 may be at least partially implemented using CMOS circuitry. It will be appreciated, however, that techniques other than CMOS that may be used for manufacturing circuitry may be used in combination with or in lieu of CMOS for implementing the quenching circuit 110 of some example embodiments.

The photodetection circuit 100 may further include an integration circuit 112, which may be coupled with the avalanche photodiode 102 and may be configured to integrate photocurrent output by the avalanche photodiode 102 when the photodetection circuit 100 is operated in linear mode. The integration circuit 112 may be further configured to generate and output integrated charge units based at least in part on the integrated photocurrent. In some example embodiments, the integration circuit 112 may include a sigma-delta modulation circuit, such as that illustrated in and described below with respect to FIG. 7. It will be appreciated, however, that any circuit which may be configured to integrate photocurrent and generate integrated charge units may be used in addition to or in lieu of a sigma-delta modulation circuit to implement the integration circuit 112 in accordance with various example embodiments.

In some example embodiments, the integration circuit 112 may be at least partially implemented using CMOS circuitry. It will be appreciated, however, that techniques other than CMOS that may be used for manufacturing circuitry may be used in combination with or in lieu of CMOS for implementing the integration circuit 112 of some example embodiments.

The photodetection circuit 100 may further include a counter (or counters) 114. The counter 114 may be configured to count an amount of light (e.g., units of light) detected by the avalanche photodiode 102. In this regard, the counter 114 may be configured to count pulses output by the avalanche photodiode 102 in response to photon impact events when the photodetection circuit 100 is operated in Geiger mode. For example, the counter 114 of some example embodiments may be configured to directly count a pulse that may be output by the avalanche photodiode 102 in response to a photon impact event. As another example, in some example embodiments, the counter 114 may be configured to count a pulse output by the avalanche photodiode 102 based on a logic pulse that may be output by the quenching circuit 110 of some example embodiments in response to a pulse output by the avalanche photodiode 102. When the photodetection circuit 100 is operated in linear mode, the counter 114 may be configured to count integrated charge units output by the integration circuit 112.

In some example embodiments, a single counter 114 or set of counters 114 may be used to count both pulses output by the avalanche photodiode 102 events when the photodetection circuit 100 is operated in Geiger mode and integrated charge units output by the integration circuit 112 when the photodetection circuit 100 is operated in linear mode. However, in some example embodiments, a first counter 114 or set of counters 114 may be used to count pulses output by the avalanche photodiode 102 events when the photodetection circuit 100 is operated in Geiger mode and a second counter 114 or set of counters 114 may be used to count integrated charge units output by the integration circuit 112 when the photodetection circuit 100 is operated in linear mode. As such, while the example photodetection circuit 100 illustrated in FIG. 1 illustrates a single counter 114, a variety of alternative implementations are contemplated within the scope of the disclosure.

In some example embodiments, the counter 114 may be at least partially implemented using CMOS circuitry. It will be appreciated, however, that techniques other than CMOS that may be used for manufacturing circuitry may be used in combination with or in lieu of CMOS for implementing the counter 114 of some example embodiments.

In some example embodiments in which a single counter 114 or set of counters 114 is used to count both pulses output by the avalanche photodiode 102 events when the photodetection circuit 100 is operated in Geiger mode and integrated charge units output by the integration circuit 112 when the photodetection circuit 100 is operated in linear mode, the photodetection circuit 100 may include a multiplexer (mux) 116, which may, for example, be a 2:1 mux. The mux 116 may be configured to selectively multiplex the output of the quenching circuit 110 (e.g., when the photodetection circuit 100 is operated in Geiger mode) and the output of the integration circuit 112 (e.g., when the photodetection circuit 100 is operated in linear mode) to an output of the mux 116, which may be input to the counter 114.

In some example embodiments, the mux 116 may be configured to select between outputting the output of the quenching circuit 110 and the output of the integration circuit 112 in response to a selection signal (SEL) 118. The SEL 118 may, for example, have a digital logic value of either 0 or 1. Thus, for example, when SEL 118 is set to one of 0 or 1, the mux 116 may output the output of the quenching circuit 110, and when SEL 118 is set to the other of 0 or 1, the mux 116 may output the output of the integration circuit 112. Accordingly, a logical value of SEL 118 may be changed in accordance with a mode in which the photodetection circuit 100 is being operated such that the output of the quenching circuit 110 may be supplied to the counter 114 when the photodetection circuit 100 is operated in Geiger mode and the output of the integration circuit 112 may be supplied to the counter 114 when the photodetection circuit 100 is operated in linear mode.

In some example embodiments, the mux 116 may be at least partially implemented using CMOS circuitry. It will be appreciated, however, that techniques other than CMOS that may be used for manufacturing circuitry may be used in combination with or in lieu of CMOS for implementing the mux 116 of some example embodiments. Further, it will be appreciated, however, that while the example embodiment of the photodetection circuit 100 illustrated in FIG. 1 includes a mux 116, the mux 116 may be omitted in some embodiments.

The photodetection circuit 100 may also include counter readout circuit 120. The counter readout circuit 120 may be implemented as any circuitry that may be configured to read a value that may be maintained in the counter (or counters) 114 based on an amount of light detected by the avalanche photodiode 102. Thus, for example, when the photodetection circuit 100 is operated in Geiger mode, the counter readout circuit 120 may be configured to read a value indicative of a number of photon impact events detected by the avalanche photodiode 102 that may be maintained by the counter 114 in Geiger mode. As a further example, when the photodetection circuit 100 is operated in linear mode, the counter readout circuit 120 may be configured to read a value indicative of a number of integrated charge units generated and output by the integration circuit 112.

In some example embodiments, the counter readout circuit 120 may include a shift register that may be configured to shift data out of the counter 114 to enable reading a value stored in the counter 114. It will be appreciated, however, that other techniques, including various destructive and non-destructive readout techniques, that may be used to read a value maintained by a counter, such as a counter 114, may be used by the counter readout circuit 120 in addition to or in lieu of a shift register in accordance with various embodiments.

In some example embodiments, the counter readout circuit 120 may be at least partially implemented using CMOS circuitry. It will be appreciated, however, that techniques other than CMOS that may be used for manufacturing circuitry may be used in combination with or in lieu of CMOS for implementing the counter readout circuit 120 of some example embodiments.

In some example embodiments, such as that illustrated in and described below with respect to FIG. 10, a photodetection circuit, such as photodetection circuit 100, may include multiple pixel units (e.g., an array of pixel units), with each pixel unit including one or more avalanche photodiodes 102. In such embodiments, the counter readout circuit 120 may be configured to readout a counter value associated with each of a plurality of pixel units. In some such example embodiments, the counter readout circuit 120 may be implemented via a synchronous readout architecture that may be configured to use a synchronous readout technique to readout the pixel counter values. In a synchronous circuit architecture, a common signal (typically referred to as a "clock" signal) may be globally distributed to control data flow between combinational logic circuits. Alternatively, in some such example embodiments, the counter readout circuit 120 may be implemented via an asynchronous readout architecture that may be configured to use an asynchronous readout technique to readout the pixel counter values. In an asynchronous circuit architecture, the global clock signal is replaced with local handshaking signals, which may, for example, be implemented via a "request" and "acknowledge" exchange. For example, an asynchronous counter readout circuit may use an asynchronous address-event representation protocol (AER) to readout a counter value associated with a selected pixel unit. A non-limiting example of an asynchronous readout architecture that may be used to implement the counter readout circuit 120 of some example embodiments and which may use AER is illustrated in and described below with respect to FIG. 11.

In some example embodiments, the mode switching circuit 106 may be configured to adjust the bias voltage applied to the avalanche photodiode 102 in response to a control signal. In some such embodiments, the control signal may be generated internally to the photodetection circuit 100. Additionally or alternatively, in some such embodiments, the control signal may be generated by an element implemented externally to the photodetection circuit 100, but which may be in communication with the photodetection circuit 100 to supply a control signal to the mode switching circuit 106. In some example embodiments, the control signal may be generated and supplied by a controller 122. In some embodiments, such as that illustrated in FIG. 1, the controller 122 may be implemented internally to the photodetection circuit 100. However, in some embodiments, the controller 122 may be implemented externally to the photodetection circuit 100, but may be communicatively coupled with the photodetection circuit 100 supply a control signal to the mode switching circuit 106. Further, in some embodiments, the controller 122 may be omitted entirely.

In some embodiments, the controller 122 may include a processor (or processors) and optionally a memory (or memories) storing instructions that may be executable by the processor. The processor may be implemented by various hardware processing means such as a microprocessor, a coprocessor, a controller or various other computing or processing devices including integrated circuits such as, for example, an ASIC (application specific integrated circuit), an FPGA (field programmable gate array), some combination thereof, or the like. The controller 122 may be configured to control an operating mode of the photodetection circuit 100 in accordance with defined control logic, such as may be hard coded into the processor (e.g., in implementations in which the processor is implemented as an ASIC, FPGA, or the like) and/or that may be coded in program instructions that may be stored in memory and executed by the processor.

For example, in some embodiments, the controller 122 may be configured to select an operating mode of the photodetection circuit 100 based on detected environmental conditions. In this regard, Geiger mode may be better suited for image sensing in some conditions, while linear mode may be better suited for image sensing in other conditions. For example, if a detected level of ambient light exceeds a threshold level, the controller 122 of some example embodiments may be configured to select to operate the photodetection circuit 100 in linear mode, and may send an appropriate control signal to the mode switching circuit 106. If, however, the detected level of ambient light does not exceed the threshold level, the controller 122 of some example embodiments may be configured to select to operate the photodetection circuit 100 in Geiger mode, and may send an appropriate control signal to the mode switching circuit 106.

In some example embodiments, the controller 122 may have access to a value read from the counter 114, and may be configured to selectively switch an operating mode of the photodetection circuit 100 during operation based at least in part on the value read from the counter 114. For example, in some such embodiments, the controller 122 may be communicatively coupled with the counter readout circuit 120 to enable the controller 122 to determine a value read from the counter 114 by the counter readout circuit 120. As one particular example of an operating mode switch that may be made by the controller 122 based on a value read from the counter 114, in some embodiments, if the photodetection circuit 100 is being operated in Geiger mode and a value read from the counter 114 exceeds a threshold value, the controller 122 may be configured to determine to switch the operating mode of the photodetection circuit 100 to linear mode, and may send an appropriate control signal to the mode switching circuit 106.

Having now generally described various example embodiments of the photodetection circuit 100 and various methods for operation thereof, several particular embodiments of components that may be used in the photodetection circuit 100, as well as various architectures that may be used to implement and/or that may include embodiments of photodetection circuit 100 will now be described below with respect to FIGS. 2-11.

FIG. 2 illustrates a cross section of an example avalanche photodiode 200 that may be used in a photodetection circuit, such as photodetection circuit 100, in accordance with some example embodiments. In this regard, the avalanche photodiode 200 may be used to implement the avalanche photodiode 102 in accordance with some example embodiments.

With reference to FIG. 2, the avalanche photodiode 200 may, for example, be fabricated in a 1.8 V deep-submicron 0.18 μm (micrometer) non-epitaxial CMOS process. However, it will be appreciated that an epitaxial process may also be employed without changing the architecture of the avalanche photodiode 200. The avalanche photodiode 200 may have a circular/cylindrical shape in some example embodiments, but other shapes and topologies are contemplated within the scope of the disclosure. The avalanche photodiode 200 may include a p++ region 202 substantially overlying a central n-well 204. The combination of this central n-well 204 and the p++ region 202 forms a photosensitive junction and avalanche multiplication region 206 in the center of the avalanche photodiode 200. A deep n-well 208, such as may be formed through the process of buried ion implantation during fabrication, may substantially underlie the central n-well 204. Well guard regions 210, which may be made of a lightly doped p-type material (also found in the bulk p-type substrate 212), form guard rings extending substantially about the periphery of the avalanche multiplication region 206 (in the central part of the photosensitive area) at least partially underlying the p++ region 202 and the central n-well 204 (thereby enclosing the edges 214 of the p++ region 202). In some example embodiments, the well guard regions 210 may be designed so that they are larger than the deep n-well 208 by forming a ring of outer n-well 216 about the perimeter of the deep n-well 208 such that the outer n-well 216 extends both inside and outside the deep n-well 208.

An anode 218 may form a ring about and overly the edge 214 of a silicide region. The anode 218 may, by way of non-limiting example, be made from a combination of a heavily doped active region silicide and a stack of 220 of one or more metal vias and contacts. A cathode 222 may, for example, be made of a combination of a heavily doped active region silicide and a stack of one or more metal vias and contacts. The cathode 222 may form a ring about and may be attached to the outer n-well 216 to provide electrical contact to both the deep n-well region 208 and the outer n-well 216.

Bulk ring contacts 224 may be formed in the bulk p-type substrate 212, which may extend substantially about the outer n-well 216 and the deep n-well 208. The bulk terminal 226 may provide electrical contact for bulk ring contacts 224. In example embodiments in which all regions of the avalanche photodiode 200 are circular, the regions may be substantially symmetrical, including the well guard ring 210 with bulk ring contacts 224 surrounding the central region of the avalanche photodiode 200, which permits a constant electric potential region to be maintained in the avalanche multiplication region 206.

Table 1 shows example design parameters of a 10 μm diameter avalanche photodiode constructed in accordance with an example embodiment of the avalanche photodiode 200 illustrated in FIG. 2. It will be appreciated, however, that the design parameters set forth in Table 1 are provided by way of example, and not by way of limitation. In this regard, other radii and relative size ratios for regions of the avalanche photodiode 200 are contemplated within the scope of the disclosure. Additionally, it will be appreciated that embodiments in which the avalanche photodiode 200 does not have a circular/cylindrical shape are contemplated within the scope of the disclosure. Table 1:

| Fabrication Layer | Inner Radius (μm) | Outer Radius (μm) |
|---|---|---|
| p++ (center) 202 | 0 | 7 |
| Deep n-well 208 | 0 | 11 |
| n-well (center) 204 | 0 | 5 |
| n-well (peripheral) 216 | 9 | 13 |
| Photosensitive area (center) 206 | 0 | 5 |
| Metal 1 | 11 | 13 |
| Metal 6 | 5 | 8 |

In order for the guard ring 210 to properly shield the edge 214 from premature breakdown, the p++ region 202 may be fabricated such that the edge 214 extends into the well guard region 210 enough to enclose the bottom and side of the avalanche multiplication region 206 for the full extent of the lateral doping variation the p++ region 202, which may not be perfectly squared off at the edges. By the same token, in some example embodiments, the p++ region 202 may not extend so far as to present a potentially problematic junction with the outer n-well region 216 on the other side of the well guard ring 210 (between the well guard ring 210 and the outer n-well region 216), and thus may extend about halfway across the well guard ring 210.

The avalanche multiplication region 206 may be defined as the abutment of the p++ region 202 with the inner n-well 204 for the full extent of the region between the well guard ring 210. When fabricated, the well guard ring 210 may not abruptly be defined. The well guard ring 210 may form a depletion region along the borders 228 with the n-well 204 and outer n-well 216.

In the embodiment illustrated in FIG. 2, light 230 may be received to a "front-side" surface of the avalanche photodiode 200 that includes the anode 218, cathode 222, and bulk terminal 226. However, in some example embodiments, an avalanche photodiode that may be used to implement the avalanche photodiode 102 may be flipped such that a surface exposed to receive light may be a "back-side" of the avalanche photodiode which may be comprised of a surface formed by the bulk p-type substrate 212. In this regard, the back-side of the avalanche photodiode of some example embodiments may provide a larger uninterrupted surface area for gathering light than the front-side due to the presence of metal portions, such as the anode 218, cathode 222, and bulk terminal 226, which may reduce the surface area available for receiving light.

FIG. 3 illustrates a cross section of an example avalanche photodiode 300 that may be used in a photodetection circuit, such as photodetection circuit 100, in accordance with some example embodiments in which light may be gathered via the back-side of the avalanche photodiode rather than the front-side as in the avalanche photodiode 200. In this regard, the avalanche photodiode 300 may be used to implement the avalanche photodiode 102 in accordance with some example embodiments. The avalanche photodiode 300 may be implemented substantially similarly to the avalanche photodiode 200 described above. However, the orientation of the avalanche photodiode 300 when used in a photodetection circuit, such as the photodetection circuit 100 may be reversed from that of the avalanche photodiode 200 such that light 302 may be received via the back-side of the avalanche photodiode 300. In some example embodiments, a thickness of the bulk p-type substrate 314 may be thinned compared to a thickness of the bulk p-type substrate 212 of the avalanche photodiode 200 so as to allow light transmission through the avalanche photodiode 300. Details on implementing avalanche photodiodes, such as avalanche photodiodes 102, 200, and 300, are known to those skilled in the art, as exemplified by U.S. Pat. No. 8,259,293.

Figure 4A:
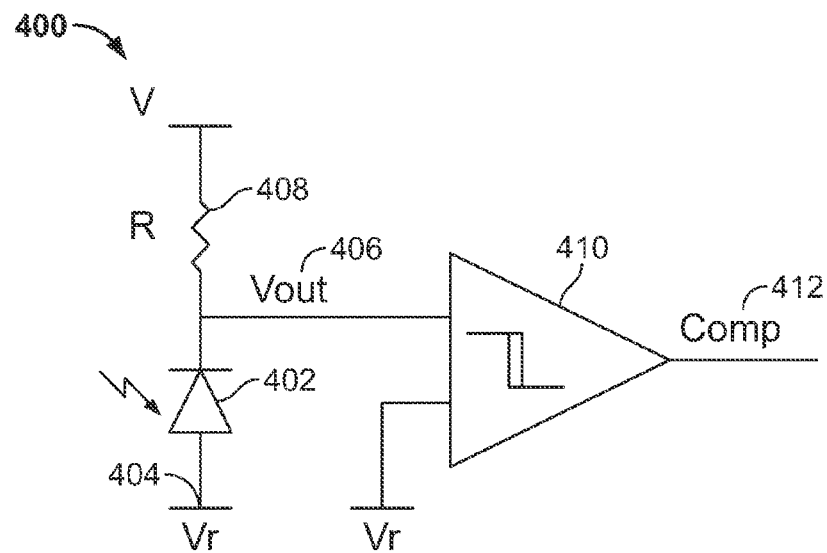
FIG. 4A illustrates an example passive quenching circuit that may be used in a photodetection circuit in accordance with some example embodiments.

FIG. 4A illustrates an example passive quenching circuit 400 that may be used in a photodetection circuit, such as photodetection circuit 100, in accordance with some example embodiments. In this regard, the passive quenching circuit 400 may be used to at least partially implement the quenching circuit 110 in accordance with some example embodiments. It will be appreciated, however, that the passive quenching circuit 400 is provided by way of example, not by way of limitation, and that alternative embodiments of a passive quenching circuit that may be used to implement the quenching circuit 110 are contemplated within the scope of the disclosure.

The passive quenching circuit 400 may be coupled with an avalanche photodiode 402, which may, for example, be an embodiment of the avalanche photodiode 102. When operated in Geiger mode, the anode (Vr) 404 of the avalanche photodiode 402 may be set to a negative voltage such that the difference between Vout 406 and Vr 404 is greater than the breakdown voltage associated with the avalanche photodiode 402. During an avalanche event, the reverse current through the avalanche photodiode 402 may discharge Vout 406, which brings the bias voltage below breakdown voltage. As the voltage of the Vout node 406 lowers, a potential difference across the resistor (R) 408 is created, which serves to passively recharge the Vout node 406 such that the bias voltage again exceeds the breakdown voltage. In some example embodiments, the Vout node 406 may be connected to a voltage comparator 410, which may be configured to convert the avalanche pulse into a logical pulse (Comp) 412, which may be counted by a counter, such as the counter 114.

Figure 4B:
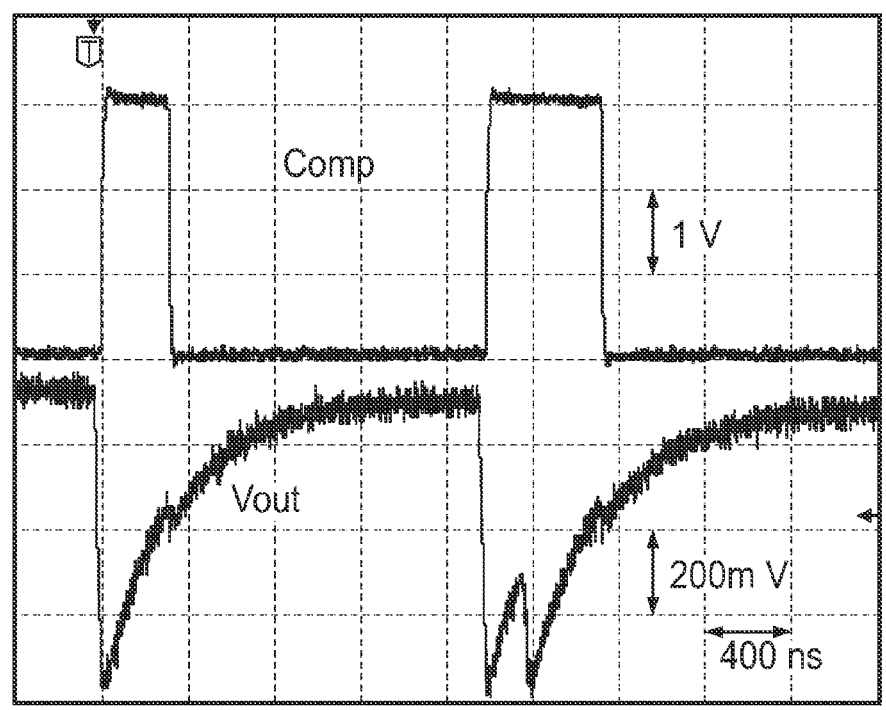
FIG. 4B illustrates an example oscilloscope trace of an avalanche photodiode quenched by a passive quenching circuit in accordance with some example embodiments.

FIG. 4B illustrates an example oscilloscope trace of an avalanche photodiode quenched by a passive quenching circuit in accordance with some example embodiments. In this regard, FIG. 4B illustrates an oscilloscope trace of an example avalanche photodiode 402 quenched by an embodiment of the passive quenching circuit 400 and the output of the voltage comparator 410. With reference to FIG. 4B, it may be seen that the second Vout pulse has two peaks. However, a second logical Comp pulse is not generated by the voltage comparator 410 since the voltage of Vout is below the threshold of the voltage comparator 410. The time interval in which the second peak occurred is called the "dead-time." Any Vout pulses generated within the dead-time are not recorded by the voltage comparator 410, and thus may not be counted by a counter, such as the counter 114, thus affecting the timing resolution of a photodetection circuit using a passive quenching circuit. The length of the dead-time may be determined as a function of the RC (resistor-capacitor) time constant of the quench resistor (R) 408 and any parasitic capacitances on the Vout node 406. In the example implementation of the passive quenching circuit 400 used to generate the trace of FIG. 4B the resistor 408 has a value of 10 kΩ The rise time is about 1000 ns, which leads to a capacitance of 45 pF (picofarads). Accordingly, a photodetection circuit using the passive quenching circuit used to generate the trace of FIG. 4B can only operate at a maximum of $10^6$ counts per second (c/s). However, as on-chip capacitances are in the range of femtofarads, a passive quenching circuit, such as passive quenching circuit 400, implemented using CMOS integration may have reduced dead-time compared to the passive quenching circuit used to generate the trace of FIG. 4B. For example, some passive quenching circuits implemented using CMOS integration may have a maximum count rate on the order of $10^9$ c/s due to the three orders of magnitude difference in capacitance between a passive quenching circuit implemented using CMOS integration and the passive quenching circuit used to generate the trace of FIG. 4B.

Dead-time can be further reduced through the use of an active quenching circuit, such as that illustrated in and described below with respect to FIG. 5A, which may be configured to lower the reverse bias in response to the onset of an avalanche pulse and to reset the avalanche photodiode following a delay period by raising the bias voltage above the breakdown voltage. This reset delay period may serve to reduce the effect of after-pulsing. In active quenching circuits implemented using modern CMOS processes, the delay period may be on the order of a minimum of hundreds of picoseconds. However, it will be appreciated that the delay period may vary as suitable for a particular circuit implementation.

Figure 5A:
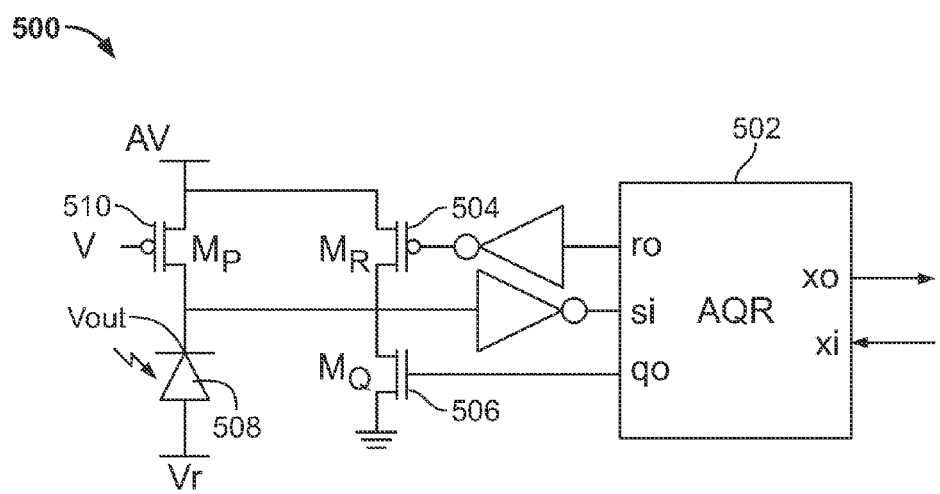
FIG. 5A illustrates an example implementation of an active quenching circuit that may be used in a photodetection circuit in accordance with some example embodiments.

FIG. 5A illustrates an example implementation of an active quenching circuit 500 that may be used in a photodetection circuit, such as photodetection circuit 100, in accordance with some example embodiments. The active quenching circuit 500 may be coupled with an avalanche photodiode 508, which may, for example, be an embodiment of the avalanche photodiode 102. The active quenching circuit 500 may include an active quench and reset circuit (AQR) 502.

The AQR 502 may be implemented as an asynchronous circuit configured to control reset and quench transistors, $M_R$ 504 and $M_Q$ 506. The AQR 502 may have inputs si and xi and may have outputs ro, qo, and xo. Example implementations that may be used to provide AQR 502 are illustrated in and described below with respect to FIGS. 6 and 15. When an avalanche event occurs, si is raised, which causes the AQR 502 to assert qo. Assertion of qo by the AQR 502 may turn on $M_Q$ 506, keeping the bias voltage of the avalanche photodiode 508 below the breakdown voltage. The AQR 502 may be further configured to assert xo, which serves as a request to a subsequent logic block, such as the logic block 1020 illustrated in FIG. 10 as described further herein below. This logic block may be configured to measure the time between the sync pulse and the xo pulse from the AQR 502, which signifies the arrival of a photon. Measurement of the time between the sync pulse and the xo pulse may be useful for applications that require timing information, such as various laser radar (LADAR) or optical communication applications. The sync pulse may, for example, be generated from an external control signal to initiate the start of a photon time of arrival measurement. The logic block may be further configured to acknowledge the request by raising xi. In response to receiving the acknowledgement xi, the AQR 502 may be configured to lower qo and raises ro to reset the bias voltage of the avalanche photodiode 508 above the breakdown voltage. Transistor $M_P$ 510 may be configured to counter any dark current generated by the avalanche photodiode 508 when the bias voltage is below the breakdown voltage.

Figure 5B:
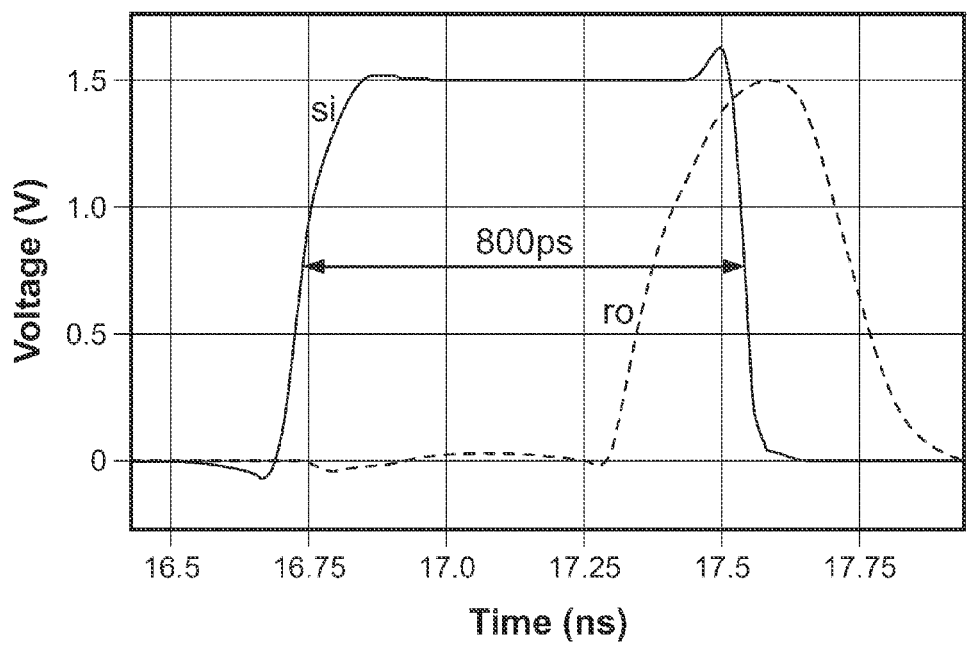
FIG. 5B illustrates an example simulation of an embodiment of the active quenching circuit of FIG. 5A in accordance with some example embodiments.

FIG. 5B illustrates an example simulation of an embodiment of the active quenching circuit 500 formed using a 0.13 μm CMOS process. As may be seen from the simulation of si in FIG. 5B, the avalanche photodiode 508 may be quenched and reset approximately 800 ps following the avalanche event. In this regard, the avalanche photodiode 508 may be reset in response to ro being raised following a delay period, resulting in the value of si dropping to approximately 0 approximately 800 ps following the value of si being raised in response to the avalanche event.

The AQR 502 may be generated by using Martin's synthesis procedure for asynchronous circuits. Using a four-phase handshake, the handshaking expansion (HSE) for the AQR 502 may be expressed as:

AQR#
*[[si];qo+,xo+; [xi]; p+; qo−, xo−;
 [~xi];ro+;p−;[~si];ro−]

In this regard, si may go to high to signify an avalanche event. Raising the value of si may cause qo and xo to fire. qo may be connected to an n-type metal-oxide-semiconductor (NMOS) transistor (e.g., $M_Q$ 506) which may be configured to actively quench the avalanche photodiode 508. Assertion of xo communicates the event to an external circuit, or logic block, as discussed above. The AQR 502 may wait for an acknowledge ([xi]), and, in response to receiving the acknowledgement, may reset signals (qo− and xo−) and actively reset (ro+) the avalanche photodiode 508. p is a state variable that may be used to enforce sequencing. The HSE notation used in the foregoing HSE for the AQR 502 may be defined as follows in Table 2:

| HSE NOTATION | | |
|---|---|---|
| Operation | Notation | Explanation |
| Signal | v | Voltage on a node |
| Complement | ~v | Inversion of v |
| And | v & w | High if both are high |
| Or | v \| w | Low if both are low |
| Set | v+ | Drive v high |
| Clear | v− | Drive v low |
| Wait | [v] | Wait till v is high |
| Sequential | [u]; v+ | Drive v high after u is high |
| Concurrent | v+, w+ | Drive v and w high |
| Repetition | *[v+; v−] | Repeats forever |

Figure 6:
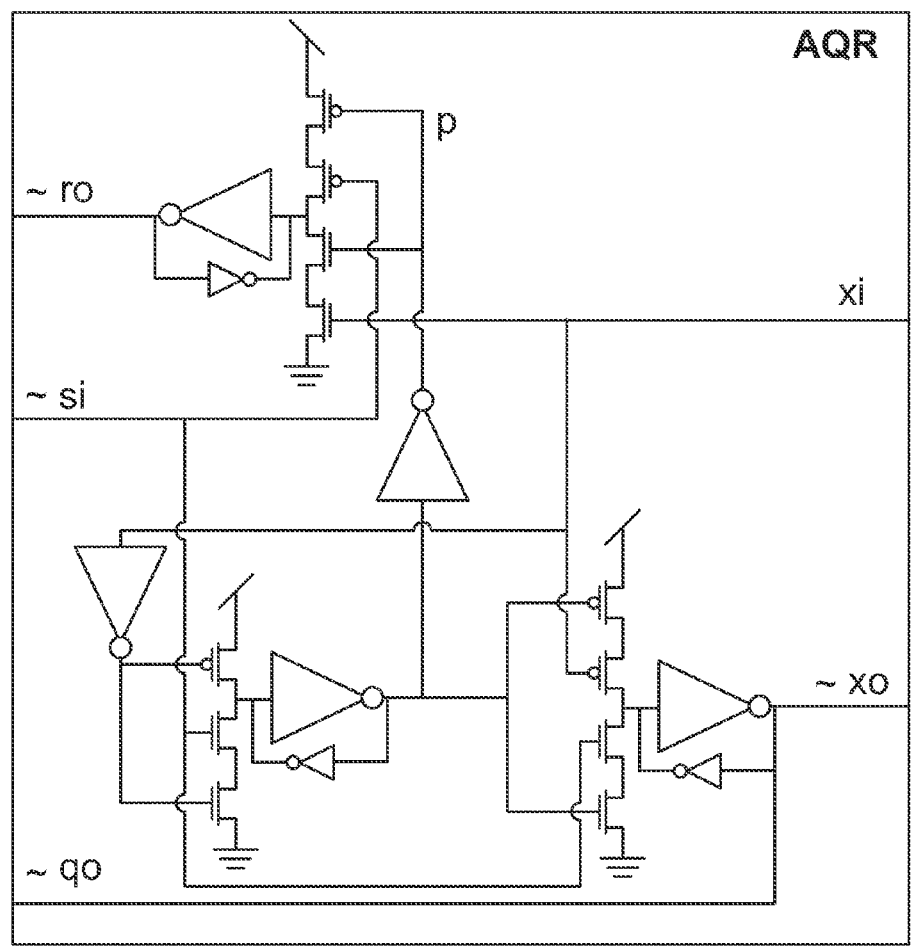
FIG. 6 illustrates an example circuit that may be used to provide an active quenching circuit that may be used in a photodetection circuit in accordance with some example embodiments.

Referring now to FIG. 6, FIG. 6 illustrates an example circuit that may be used to provide an active quenching circuit that may be used in a photodetection circuit, such as photodetection circuit 102, in accordance with some example embodiments. In this regard, FIG. 6 illustrates example synthesized circuits that may be used to implement the AQR 502 in accordance with the previously-discussed example HSE for the AQR 502. It will be appreciated, however, that the circuits illustrated in FIG. 6 are provided by way of example, and not by way of limitation. In this regard, other circuits which may be used to implement the AQR 502 are contemplated within the scope of the disclosure.

Figure 7:
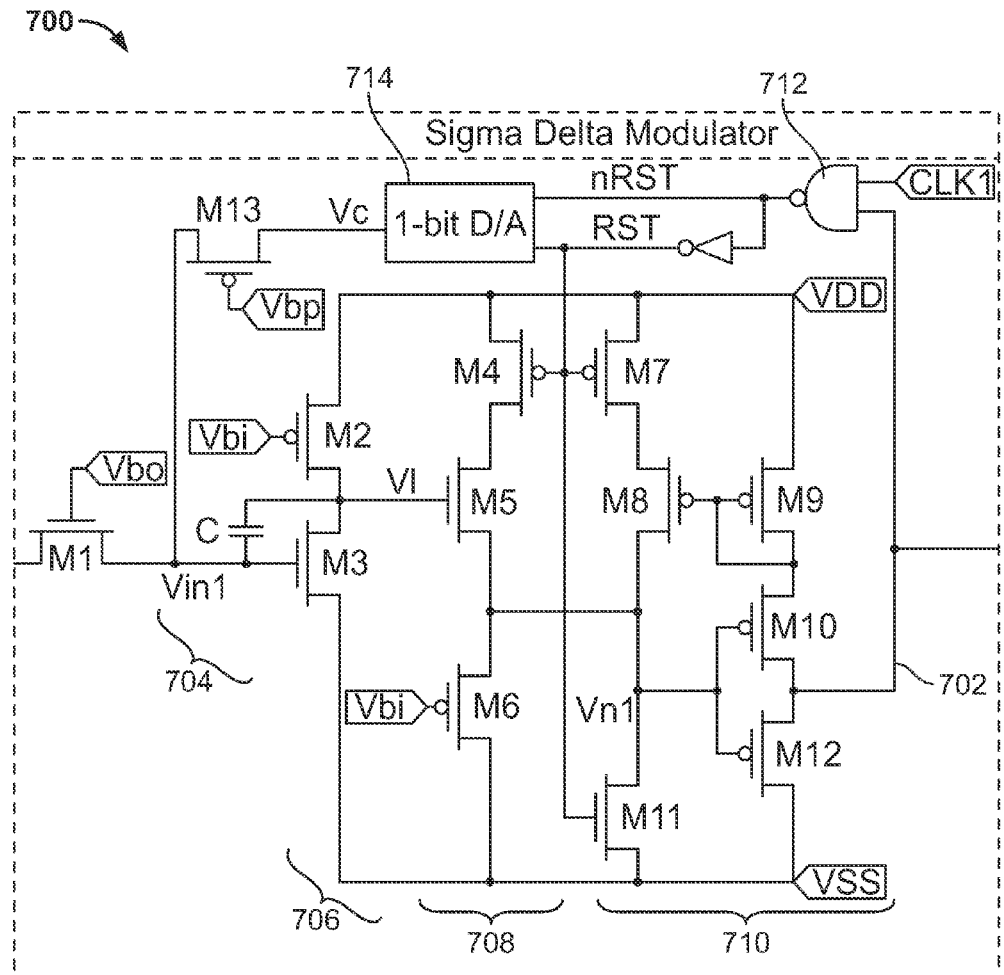
FIG. 7 illustrates a diagram of an example sigma-delta modulation circuit that may be used as an integration circuit in a photodetection circuit in accordance with some example embodiments.

FIG. 7 illustrates a diagram of an example sigma-delta modulation circuit 700 that may be used as an integration circuit in a photodetection circuit, such as the photodetection circuit 100, in accordance with some example embodiments. In this regard, the sigma-delta modulation circuit 700 may be used to implement the integration circuit 112 in accordance with some example embodiments. It will be appreciated, however, that the sigma-delta modulation circuit 700 is provided by way of example, and not by way of limitation. In this regard, other types of sigma-delta modulation circuits and/or other types of integration circuits may be substituted for the sigma-delta modulation circuit 700 within the scope of the disclosure.

The sigma-delta modulation circuit 700 may be configured to produce a train of pulses (e.g., integrated charge units) on a sigma-delta output 702 based at least in part on current through an avalanche photodiode, such as avalanche photodiode 102, when operated in linear mode. The sigma-delta modulation circuit 700 may include an integrator 704, which may comprise a capacitor and an amplifier 706. The integrator 704 may be configured to produce a sloping voltage (e.g., a downward sloping or upward sloping voltage), and the sloping voltage may be buffered through the follower 708 and used as an input to the comparator 710. The comparator 710 may be configured to produce a pulse on the comparator output 702 whenever the buffered voltage crosses a threshold voltage, thereby producing a pulse train (e.g., a train of integrated charge units) characteristic of sigma-delta converters. The comparator output 702 may be fed back through the NAND gate 712 to the digital-to-analog (D/A) converter 714, thereby closing the loop in the sigma-delta modulation circuit 700. The D/A converter 714 may, for example, be implemented as a 1-bit D/A converter. It will be appreciated that D/A converters other than 1-bit D/A converters may be used within the scope of the disclosure. The comparator output 702 may be supplied to a counter, such as the counter 114, which may be configured to count pulses output by the sigma-delta modulation circuit 700.

Figure 8:
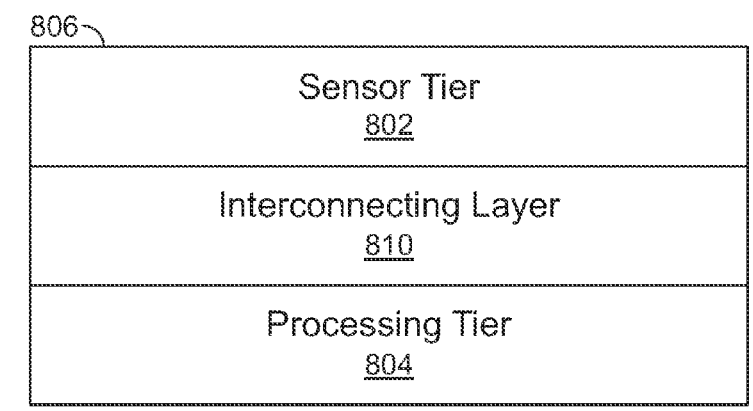
FIG. 8 illustrates a high level block diagram of a tiered architecture of a photodetection circuit in accordance with some example embodiments.

In some example embodiments, a photodetection circuit, such as the photodetection circuit 100, may be implemented as a 3D tiered structure. FIG. 8 illustrates a high level block diagram of a tiered architecture 800 of a photodetection circuit in accordance with some such example embodiments. As illustrated in FIG. 8, the tiered architecture 800 may include a sensor tier 802 and one or more processing tiers 804 underlying the sensor tier 802. It will be appreciated that while FIG. 8 illustrates a structure with two tiers and a single processing tier 804, in some example embodiments, a tiered photodetection circuit may include three or more tiers and, in some such embodiments, may include multiple processing tiers 804. Each tier may, for example, be implemented on a respective silicon wafer having circuitry implemented thereon.

The sensor tier 802 may have an exposed surface 806 positioned to receive photons of lights and may include one or more avalanche photodiodes, such as one or more avalanche photodiodes 102, positioned to detect photons striking the exposed surface 806 of the sensor tier 802. Processing elements of the photodetection circuit, such as the quenching circuit 110, integration circuit 112, and counter 114, may be implemented within the one or more processing tiers 804. In this regard, by using the 3D tiered structure and implementing the processing elements within the processing tier(s) 804 underlying the sensor tier 802, an increased portion of the exposed surface area of a photodetection circuit (e.g., the exposed surface 806) may be dedicated to photosensing rather than being used for processing elements, thus improving an efficiency with which the photodetection circuit may capture and detect light. Furthermore, in photodetection circuits comprising multiple pixel units (e.g., an array of pixel units), with each pixel unit including one or more avalanche photodiodes, a photodetection circuit implemented using this tiered structure may have a greater pixel fill factor than circuits implementing both the sensing elements and the processing elements on a single layer chip, as a smaller percentage of the exposed surface area of the single layer chip may be used for photodetection by the pixel units.

Communication between elements disposed in different tiers may be enabled through interconnecting layer 810. Interconnecting layer 810 may, for example, include vias, such as through silicon vias (TSVs), to facilitate electrically coupling elements in the sensor tier 802 with elements in the processing tier 804. In this regard, a TSV may be used to electrically couple an element implemented in the sensor tier 802 with an element implemented in a processing tier 804 such that an electrical signal may be communicated between the elements.

In some example embodiments using a tiered structure to implement a photodetection circuit, such as the photodetection circuit 100, 3D CMOS technologies may be used to implement one or more tiers. Thus, for example, in some embodiments, the sensor tier 802 and/or processing tier(s) 804 may be fabricated using CMOS techniques. Accordingly, for example, an avalanche photodiode, such as avalanche photodiode 102, which may be included in the sensor tier 802 may comprise CMOS circuitry. As a further example, one or more processing elements, such as, the quenching circuit 110, integration circuit 112, counter 114, and/or other processing element, that may be included in one or more processing tiers 804 underlying the sensor tier 802 may comprise CMOS circuitry.

In some example embodiments using a tiered structure to implement a photodetection circuit, such as the photodetection circuit 100, two or more tiers of the 3D stack may be fabricated using different technologies. Thus, for example, the sensor tier 802 may be fabricated using a first technology, and a processing tier 803 may be fabricated using a second technology. In this regard, a technology that is optimum for one or more circuits implemented in that particular tier. Thus, for example, in some embodiments, a CMOS tier may be stacked with an NMOS tier, PMOS tier, some combination thereof, or the like.

Figure 9:
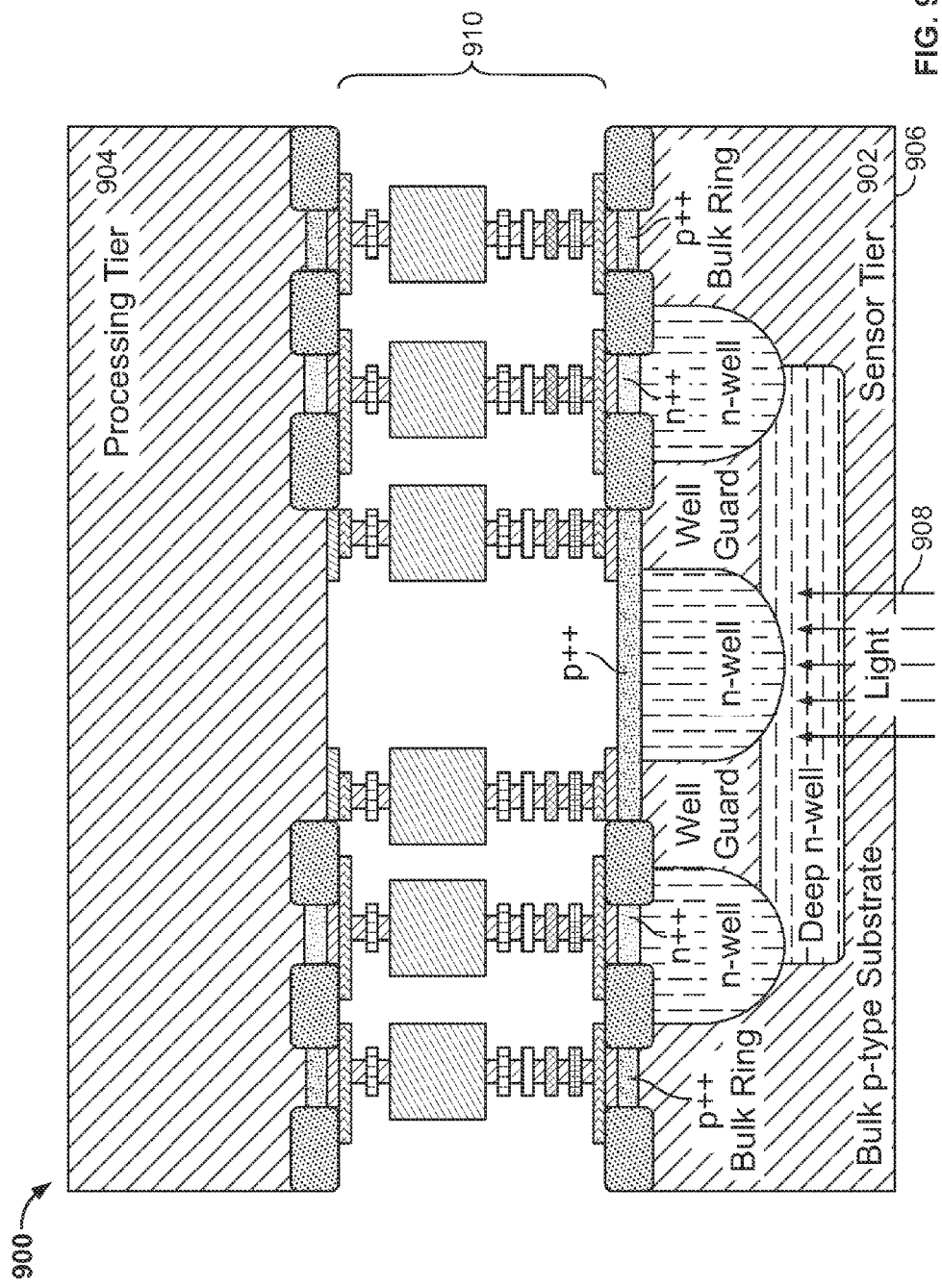
FIG. 9 illustrates a cross section of a tiered photodetection circuit in accordance with some example embodiments.

FIG. 9 illustrates a cross section of a tiered photodetection circuit 900 in accordance with some example embodiments. The photodetection circuit 900 may, for example, be an embodiment of a photodetection circuit 100 having a tiered structure.

The photodetection circuit 900 may include a sensor tier 902, which may be an embodiment of the sensor tier 802. The sensor tier 902 may include an avalanche photodiode, which may, for example, be an embodiment of the avalanche photodiode 300 discussed above with respect to FIG. 3. As illustrated in FIG. 9, the sensor tier 902 may include an exposed surface 906 via which light 908 may be detected by the avalanche photodiode implemented within the sensor tier 902.

The photodetection circuit 900 may further include a processing tier 904, which may be an embodiment of the sensor tier 804. The processing tier 904 may include one or more processing elements, such as the quenching circuit 110, integration circuit 112, counter 114, and/or other processing element that may be used in a photodetection circuit in accordance with various example embodiments.

Through silicon vias (TSVs) 910 may extend from the sensor tier 902 to the processing tier 904. The TSVs 910 may be used to electrically couple processing elements of the processing tier 904 to with respective terminals, such as an anode (e.g., anode 218), cathode (e.g., cathode 222), bulk terminal (e.g., bulk terminal 226), and/or other terminal(s), of the avalanche photodiode implemented in the sensor tier 902. The TSVs 910 may, for example, be an embodiment of interconnecting layer 810.

As previously discussed, some example embodiments provide a photodetection circuit including a plurality (e.g., an array) of pixel units, each of which may include one or more avalanche photodiodes, such as avalanche photodiode 102. For example, in some embodiments, the photodetection circuit 100 may include a plurality of avalanche photodiodes 102. In some such example embodiments, each avalanche photodiode 102 may be coupled with a respective quenching circuit 110 and integration circuit 112 such that each avalanche photodiode 102 may have a dedicated quenching circuit 110 and integration circuit 112. A photodetection circuit including multiple avalanche photodiodes 102 may further include multiple counters 114. In some such example embodiments each counter 114 may be associated with and count an amount of light detected by a single avalanche photodiode 102. However, in some such example embodiments, one or more counters 114 may each be associated with and count an amount of light detected by multiple avalanche photodiodes 102. For example, in some embodiments, in which a counter 114 is configured to count an amount of light detected by multiple avalanche photodiodes 102, the counter 114 may be configured to count an amount of light detected by a set of avalanche photodiodes 102 forming a pixel unit such that each counter 114 may count an amount of light detected by a respective pixel unit.

Figure 10:
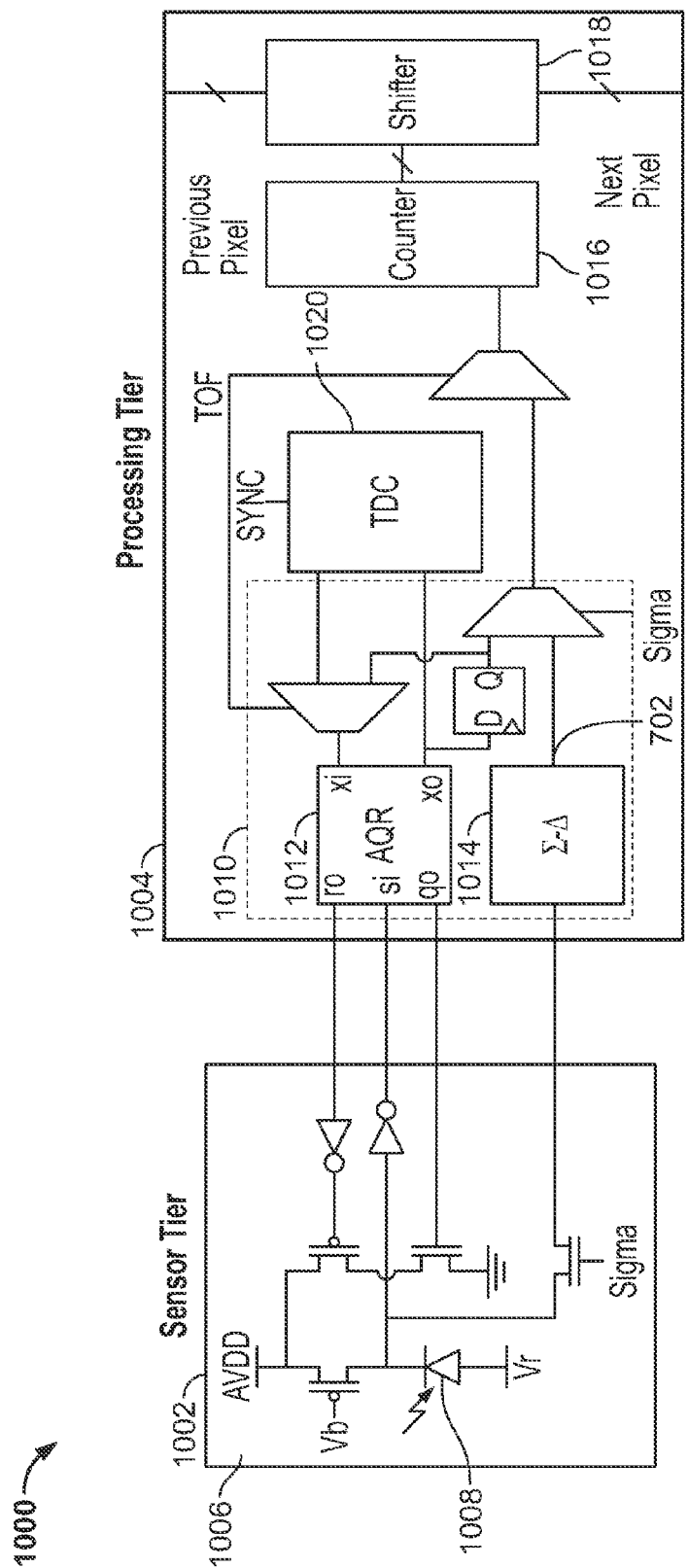
FIG. 10 illustrates a block diagram of a high level architecture of a tiered photodetection circuit in accordance with some example embodiments.

FIG. 10 illustrates a block diagram of a high level architecture of an example photodetection circuit 1000 having multiple avalanche photodiodes in accordance with some such example embodiments. More particularly, FIG. 10 illustrates a tiered photodetection circuit 1000 having multiple avalanche photodiodes, which may collectively form a pixel unit that may be used within a larger photodetection circuit. The photodetection circuit 1000 may, for example, be an embodiment of the photodetection circuit 100.

The photodetection circuit 1000 may include a sensor tier 1002, which may, for example, be an embodiment of the sensor tier 802. The photodetection circuit 1000 may further include a processing tier, which may, for example, be an embodiment of the processing tier 804. While FIG. 10 illustrates the processing tier 1004 to the side of the sensor tier 1002, it will be appreciated that this abstraction is merely for purposes of better illustrating the architecture of the photodetection circuit 1000. In this regard, the photodetection circuit 1000 may be implemented as a 3D tiered structure with the sensor tier 1002 stacked on top of the processing tier 1004, such as discussed with respect to FIG. 8 and/or FIG. 9.

The sensor tier 1002 may include an avalanche photodiode 1008 and associated circuitry facilitating quenching of the avalanche photodiode by an associated quenching circuit implemented in the processing tier 1004 and adjustment of a bias voltage applied to the avalanche photodiode 1008 (e.g., by an embodiment of mode switching circuit 106) to control a mode of operation of the photodetection circuit 1000. The avalanche photodiode 1008 may, for example, be an embodiment of the avalanche photodiode 102.

The processing tier 1004 may include a quenching circuit 1012 and integration circuit 1014. The quenching circuit 1012 may, for example, be an active quenching circuit including the AQR 502 discussed with respect to the active quenching circuit 500 illustrated in FIG. 5A. It will be appreciated, however, that other types of quenching circuits may be used to implement the quenching circuit 1012 within the scope of the disclosure. The integration circuit 1014 may, for example, be implemented using a sigma-delta modulation circuit, such as the sigma-delta modulation circuit 700 illustrated in and described with respect to FIG. 7. It will be appreciated, however, that other types of integration circuits may be used to implement the integration circuit 1014 within the scope of the disclosure.

The processing tier 1004 may further include a counter 1016 and shift-register 1018.

The counter 1016 may, for example, be an embodiment of the counter 114. In some example embodiments, the counter 1016 may be a 12-bit counter. It will be appreciated that counters having bit sizes other than 12-bits may be used to implement the counter 1016 within the scope of the disclosure. The counter 1016 may be used to count photons detected by the avalanche photodiodes 1008 included in the pixel unit when the photodetection circuit 1000 is operated in Geiger mode, and may be used as the decimation filter to count integrated charge units that may be output by the sigma-delta modulation circuits 1014 when the photodetection circuit 1000 is operated in linear mode.

The shift register 1018 may be used to shift data out of the counter 1016. In this regard, the shift register 1018 may, for example, be an embodiment of the counter readout circuit 120, which may be used to read a value stored in the counter 1016. The photodetection circuit 1000 may accordingly implement a synchronous readout architecture. The synchronous readout architecture may facilitate usage of a sigma-delta modulation circuit to implement the integration circuit 1014, which may be configured to sense photocurrent output by the avalanche photodiode 1008 during below breakdown voltage operation in linear mode.

The processing tier 1004 may additionally include logic block 1020. Logic block 1020 may be configured to measure the time between the SYNC pulse and the xo pulse from AQR 1012, which signifies the arrival of a photon.

A SIGMA control signal may be used to select between operation of the photodetection circuit 1000 in linear mode or in Geiger mode. In this regard, the SIGMA control signal may be used to control the bias voltage Vr and to select between output of the AQR 1012 and the output of sigma-delta modulation circuits 1014 for input to the counter 106.

In some example embodiments, the photodetection circuit 1000 may include a plurality of avalanche photodiodes 1008, which may collectively form a pixel unit. In such example embodiments, the sensor tier 1002 may include multiple units 1006, each of which may include a respective avalanche photodiode 1008 and associated circuitry facilitating quenching of the avalanche photodiode by an associated quenching circuit implemented in the processing tier 1004. In such example embodiments, each unit 1006 may be associated with a respective unit 1010 in the processing tier 1004. For example, in an embodiment in which four avalanche photodiodes 1008 may form a pixel unit, the pixel unit may include four units 1006 and four units 1010. Each unit 1010 may include respective quenching circuit 1012 and integration circuit 1014. In this regard, each avalanche photodiode 1008 in the sensor tier 1002 may have a dedicated quenching circuit 1012 and integration circuit 104 in the processing tier 1004. In some example embodiments, the units 1006 and 1010 forming a given pixel unit may share a counter 1010 and shift-register 1018 so as to conserve chip space rather than having a counter and shift-register dedicated to each avalanche photodiode 1008. It will be appreciated, however, that embodiments in which a dedicated counter and shift-register may be used for each avalanche photodiode 1008 are contemplated within the scope of the disclosure.

A photodetection circuit, such as the photodetection circuit 100 and/or photodetection circuit 1000, in accordance with various example embodiments may be scaled to implement a larger photodetection circuit having an array of pixels, which may be used to form an image sensor, such as may be used in a camera device. In such example embodiments each photodetection circuit unit, such as photodetection circuit 100 or photodetection circuit 1000, may form a pixel unit within the image sensor.

For example, the photodetection circuit 1000 may be implemented within a tiered image sensor chip that may be fabricated with a 0.13 µm CMOS process and 3D-integrated with post processing. The sensor tier of the image sensor chip may, for example, contain Input/Output (IO) drivers and a 108×108 array of 7 µm diameter avalanche photodiodes. The image sensor chip may include an array of pixels with each pixel comprising four of the avalanche photodiodes in the sensor tier. The underlying processing tier of the image sensor chip may contain a 54×54 array of logical signal processing pixels, each of which may, for example, include the components illustrated in and described with respect to the processing tier 1004, and be associated with four avalanche photodiodes forming a pixel unit in the sensor tier. The image sensor chip may be operated in three operating modes: 1) Linear Mode in which the avalanche photodiodes in the sensor tier may be biased below their breakdown voltage and integrated charge units may be generated and counted for each pixel in the processing tier; 2) Geiger mode in which the avalanche photodiodes in the sensor tier may be biased above their breakdown voltage and photon impact events may be counted for each pixel in the processing tier; and 3) above breakdown time-of-flight measurement mode.

In some example embodiments, a photodetection circuit having an array of pixels may be structured such that individual pixels and/or groups of pixels may be selectively operated in different modes. Thus, for example, in such embodiments, a first set of one or more pixel units may be operated in Geiger mode, while a second set of one or more pixels may be operated in linear mode.

Figure 11:
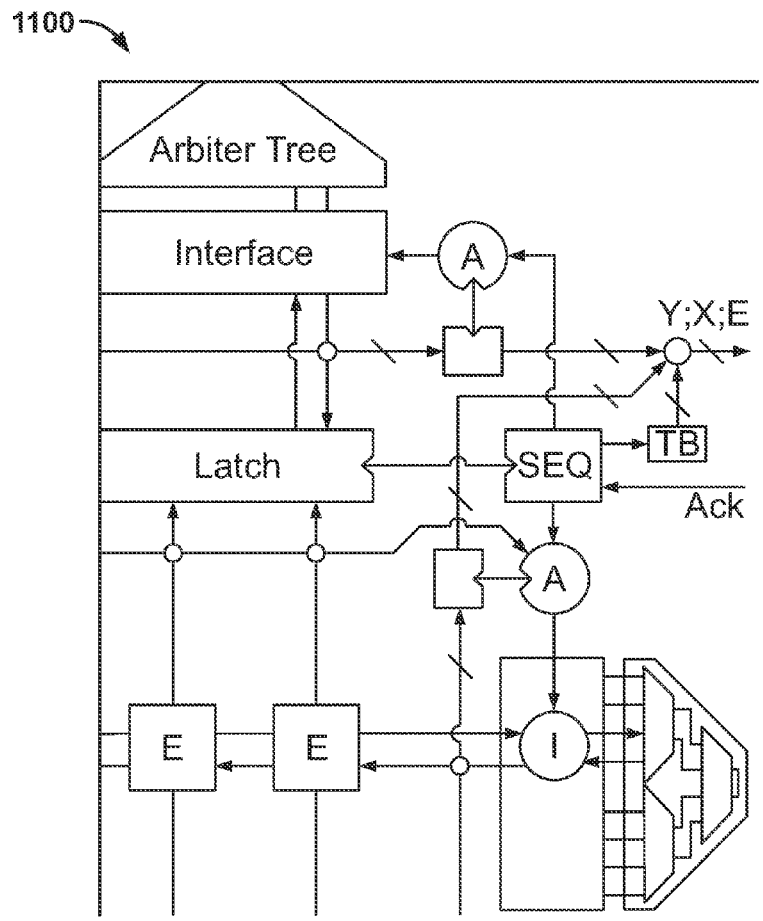
FIG. 11 illustrates a high level block diagram of an asynchronous readout architecture that may be used to read a photodetection circuit including an array of pixels in accordance with some example embodiments.

As discussed previously, while in some example embodiments, a synchronous readout circuit may be used to readout counter values for individual pixels within a photodetection circuit having an array of pixels, in some example embodiments, an asynchronous counter readout circuit using AER may be used to readout a counter value associated with a selected pixel unit. FIG. 11 illustrates a high level block diagram of an asynchronous readout architecture 1100 that may be used to read a photodetection circuit including an array of pixels in accordance with some such example embodiments.

As discussed previously, while in some example embodiments, a synchronous readout circuit may be used to readout counter values for individual pixels within a photodetection circuit having an array of pixels, in some example embodiments, an asynchronous counter readout circuit using AER may be used to readout a counter value associated with a selected pixel unit.

AER is a protocol that may be used for communicating spikes between two-dimensional arrays of silicon neurons. When a neuron generates an event, a transmitter encodes this with the address of that neuron. That address is sent over a physical link to another chip where a receiver decodes it then sends an event to a neuron with the same address. In this manner, multiple virtual point-to-point connections can be made between neurons in an array using the same physical link. In embodiments in which an asynchronous readout architecture using AER is used to read pixel values, avalanche photodiodes may replace neurons as the event generators. Further, analog-digital (A/D) converters for converting light detected by the avalanche photodiodes into digital signals may be omitted.

With reference to FIG. 11, event generators (E) can make requests to the row arbiter through an interface (I). The row arbiter can select a row and direct an encoder to output that row's address, which may be buffered (A). Selection by the arbiter also enables the row's event generators to raise their column lines, which may be latched before being relayed to the column arbiter. As was done for the row, the column arbiter may direct an encoder to iteratively output these columns' addresses to a second buffer (A). After prompting the first buffer to output the row address, the sequencer (SEQ) may repeatedly prompt the second buffer to output the column addresses until the latch signals that it is empty. In response to the latch signaling that it is empty, the sequencer may cause the tailword (TB) to be output and may prompt the latch to load the next row, which may be read out while the burst was being sent. The row, column, and tail words may be output through OR-gates. In this regard, a selected pixel row's events (e.g., counter values) may be readout in parallel and transmitted in a single packet that may be represented by a row address (Y), column address (es) (X), and tailword (E, generated by TB). Further details on asynchronous readout architectures and associated techniques that may be used to readout a photodetection circuit including an array of pixels are known in the art, as exemplified by U.S. Patent Application Publication No. 2013/00112848.

A photodetection circuit, such as photodetection circuit 100 and/or photodetection circuit 1000, in accordance with some example embodiments may use internally heterogeneous representations for the mixed signal computational structures. The heterogeneous representations may include some combination of currents, voltages, charges, and/or the like. For example, Continuous Value Continuous Time (CVCT) and/or Continuous Value Discrete Time (CVDT) representations may be used for "analog" elements, such as charge injection devices (CID), charge coupled devices (CCD), or switched capacitors (SC), and/or the like. Discrete Value Discrete Time (DVDT) may be used for "digital" elements that may be employed in Boolean computations. Discrete Value Continuous Time (DVCT) representations may also be used for computational elements, such as the integration circuit 112. In the communication literature DVCT is also known as pulse time modulation (PTM). Usage of PTM has may offer advantages due to simplicity of implementation, the lack of a requirement for digital codes, and the pulse format of the modulated carrier provides immunity to channel nonlinearity. PTM techniques may be divided into two main classes. Isochronous PTM techniques, such as pulse width modulation or pulse position modulation, may be used to carry information in some characteristic of the pulse with respect to a predetermined time frame. In asynchronous PTM (APTM) techniques, there is no time frame, but pulses can occur in continuous time and the instantaneous frequency of the pulse train (PFM) is proportional to the analog value to be encoded. For example, photons may arrive to an avalanche photodiode as discrete energy wave packets. Internally, the avalanche photodiode device may generate an electron-hole pair in response to receipt of a single photon (a DVCT signal). Through a process of avalanche multiplication these DVCT signals (electron-hole pairs) generate further electron and holes that sum up to produce an output current in the terminal of the avalanche photodiode. This output current is a CVCT signal that in turn manifest itself as a discrete pulse, that is another DVCT signal, resembling biological neural spikes. Neural spikes correspond to PFM while in CMOS technology it is preferable to employ the instantaneous frequency of the transitions (SWFM) rather than pulses as they are energetically preferable. AER is an APTM technique in which each event encodes the time of the event (pulse) and the address of the encoding processing node. Stochastic pulse time computation (SPTM), which may also be used in some of the computational structures disclosed herein, is an APTM technique that encodes the stochastic sampling of a probability density function of a signal or data at the originating node. Sigma-delta modulation is another example of a type of APTM technique that may be used in some example embodiments.

Having now described various example embodiments of photodetection circuits and operation thereof, several particular methods for operating photodetection circuits, such as photodetection circuit 100 and/or photodetection circuit 1000, in accordance with various example embodiments will now be described with respect to FIGS. 12-14.

Figure 12:
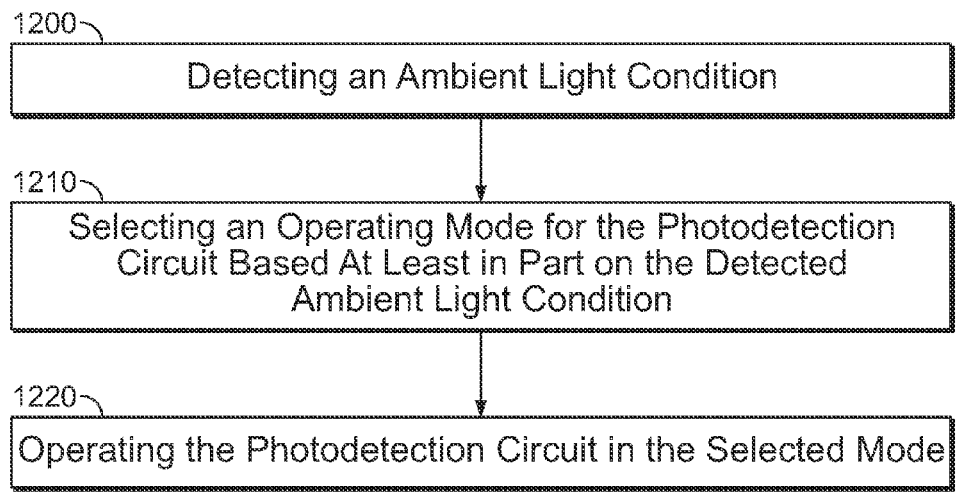
FIG. 12 illustrates flowchart according to an example method for selecting an operating mode for a photodetection circuit in accordance with some example embodiments.

FIG. 12 illustrates flowchart according to an example method for selecting an operating mode for a photodetection circuit, such as photodetection circuit 100 and/or photodetection circuit 1000, in accordance with some example embodiments. The operations illustrated in and described with respect to FIG. 12 may, for example, be performed by and/or under the control of a controller that may be configured to control an operating mode of a photodetection circuit. For example, in some example embodiments, an embodiment of the controller 122 may be configured to provide means for performing one or more of the operations illustrated in and described with respect to FIG. 12.

Operation 1200 may include detecting an ambient light condition. Detection of the ambient light condition may, for example, be performed with a dedicated ambient light level detector. As another example, detection of the ambient light condition may be determined via the photodetection circuit, itself, such as by reading a counter value (e.g., from the counter 114) indicative of an amount of light detected by the photodetection circuit.

Operation 1210 may include selecting an operating mode for the photodetection circuit based at least in part on the detected ambient light condition. For example, if the amount of ambient light is under a threshold level, Geiger mode may be selected. However, if the amount of ambient light is greater than a threshold level, linear mode may be selected.

Operation 1220 may include operating the photodetection circuit in the selected mode. In some example embodiments, operation 1220 may include a mode switching circuit, such as mode switching circuit 106, adjusting a bias voltage applied to an avalanche photodiode(s), such as an avalanche photodiode 102, to bias the avalanche photodiode(s) for operation in the selected mode. Thus, for example, if Geiger mode is selected, the bias voltage may be set to a level exceeding a breakdown voltage associated with the avalanche photodiode(s). However, if linear mode is selected, the bias voltage may be set to a level less than the breakdown voltage.

It will be appreciated that the method for selecting an operating mode described with respect to FIG. 12 may also be applied to environmental conditions other than ambient light. In this regard, certain environmental conditions and/or condition ranges may be mapped to a preferred operating mode, such that an operating mode may be selected based at least in part on a detected environmental condition.

In some instances, the method of FIG. 12 may, for example, be used to select an initial operating mode for a photodetection circuit when the photodetection circuit is activated, such as for purposes of sensing at least a portion of an image to be captured by a camera device. However, in some example embodiments, a default mode may be defined as an initial operating mode for the photodetection circuit irrespective of environmental conditions. For example, in some embodiments Geiger mode may be defined as a default initial mode of operation. If environmental conditions detected during operation are such that another mode of operation is better, then the mode may be switched during operation of the photodetection circuit, such as in accordance with the method of FIG. 12 and/or in accordance with one or more of the methods of FIGS. 13 and 14 described below.

Figure 13:
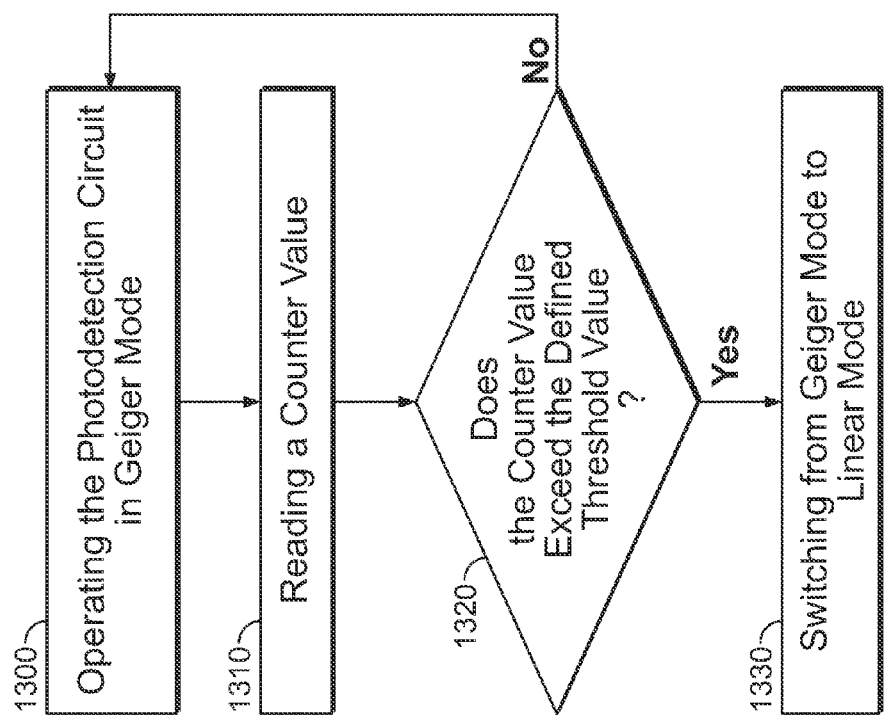
FIG. 13 illustrates a flowchart according to an example method for operating a photodetection circuit in accordance with some example embodiments.

FIG. 13 illustrates a flowchart according to an example method for operating a photodetection circuit, such as photodetection circuit 100 and/or photodetection circuit 1000, in accordance with some example embodiments. The operations illustrated in and described with respect to FIG. 13 may, for example, be performed by and/or under the control of a controller that may be configured to control an operating mode of a photodetection circuit. For example, in some example embodiments, an embodiment of the controller 122 may be configured to provide means for performing one or more of the operations illustrated in and described with respect to FIG. 13.

Operation 1300 may include operating the photodetection circuit in Geiger mode. In some example embodiments, operation 1300 can correspond to an embodiment of operation 1220 in which Geiger mode has been selected based on a detected ambient light condition.

Operation 1310 may include reading a counter value. For example, in some embodiments, operation 1310 may include the counter readout circuit 120 reading a counter value maintained by the counter 114. The counter value may be a count of a number of photon impact events detected by the photodetection circuit, or a portion thereof (e.g., by one or more pixel units implemented on the photodetection circuit).

Operation 1320 may include determining whether the counter value read in operation 1310 exceeds a defined threshold value. The threshold value may be set to any value depending on implementation. By way of non-limiting example, in some embodiments, the threshold value may be a counter overflow of a counter, such as the counter 114, which may be used to maintain the counter value.

In an instance in which it is determined that the counter value does not exceed the defined threshold value, the method may return to operation 1300. In this regard, the photodetection circuit may continue to be operated in Geiger mode. Operations 1310 and 1320 may be repeated, such as, by way of non-limiting example, at periodic intervals to determine if the operating mode should be switched.

If, however, it is determined at operation 1320 that the counter value does exceed the defined threshold value, the method may proceed to operation 1330, which may include switching the operating mode of the photodetection circuit from Geiger mode to linear mode. In some example embodiments, operation 1320 may include a mode switching circuit, such as mode switching circuit 106, adjusting a bias voltage applied to an avalanche photodiode(s), such as an avalanche photodiode 102, to a level that is less than the breakdown voltage associated with the avalanche photodiode(s).

In some example embodiments, operation 1320 may further include determining if the counter value has exceeded the defined threshold value a predetermined number of times. For example, if the counter has overflowed a number N times, then the operating mode may be switched to linear mode. If, however, the counter has not yet overflowed a total of N times, the photodetection circuit may continue to be operated in Geiger mode.

Figure 14:
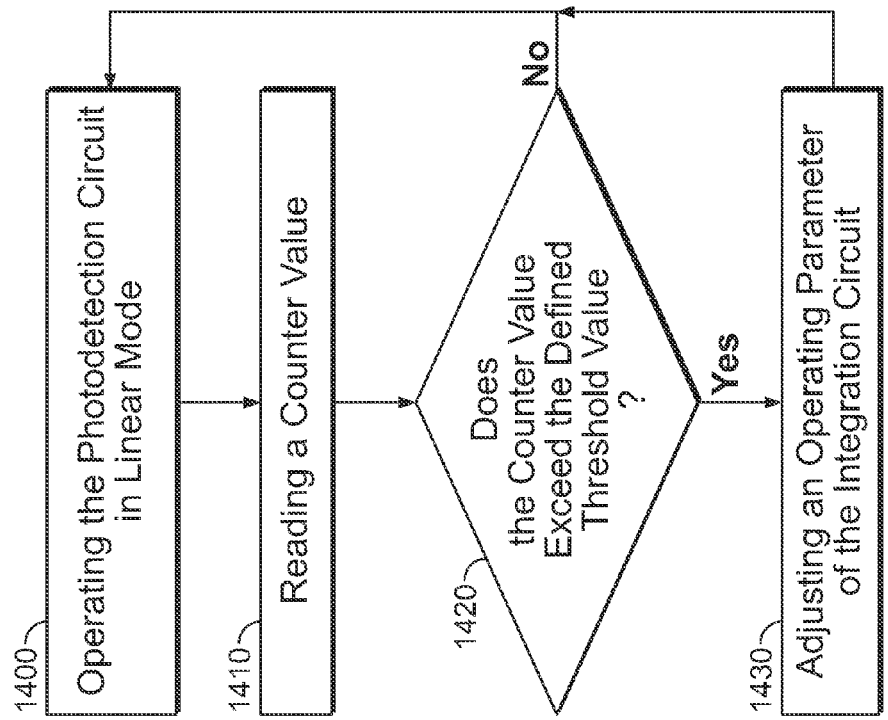
FIG. 14 illustrates a flowchart according to another example method for operating a photodetection circuit in accordance with some example embodiments.

FIG. 14 illustrates a flowchart according to another example method for operating a photodetection circuit, such as photodetection circuit 100 and/or photodetection circuit 1000, in accordance with some example embodiments. The operations illustrated in and described with respect to FIG.

14 may, for example, be performed by and/or under the control of a controller that may be configured to control an operating mode of a photodetection circuit. For example, in some example embodiments, an embodiment of the controller 122 may be configured to provide means for performing one or more of the operations illustrated in and described with respect to FIG. 14.

Operation 1400 may include operating the photodetection circuit in linear mode. For example, in some embodiments, operation 1400 may be performed subsequent to performance of operation 1330. Alternatively, as another example, in some embodiments, operation 1400 can correspond to an embodiment of operation 1220 in which linear mode has been selected based on a detected ambient light condition.

Operation 1410 may include reading a counter value. For example, in some embodiments, operation 1410 may include the counter readout circuit 120 reading a counter value maintained by the counter 114. The counter value may be a count of a number of integrated charge units generated by an integration circuit, such as integration circuit 112, based at least in part on integrated photocurrent produced from light detected by the photodetection circuit, or a portion there of (e.g., by one or more pixel units implemented on the photodetection circuit).

Operation 1420 may include determining whether the counter value read in operation 1410 exceeds a defined threshold value. The threshold value may be set to any value depending on implementation. By way of non-limiting example, in some embodiments, the threshold value may be a counter overflow of a counter, such as the counter 114, which may be used to maintain the counter value.

In an instance in which it is determined that the counter value does not exceed the defined threshold value, the method may return to operation 1400. In this regard, the photodetection circuit may continue to be operated in linear mode without changing any operating parameters of the integration circuit(s) used to generate integrated charge units from photocurrent produced by the photodetection circuit. Operations 1410 and 1420 may be repeated, such as, by way of non-limiting example, at periodic intervals to determine if any change in operating parameter and/or operating mode is needed.

If, however, it is determined at operation 1420 that the counter value does exceed the defined threshold value, the method may proceed to operation 1430, which may include adjusting an operating parameter of the integration circuit. For example, operation 1420 may include adjusting an integration time threshold and/or increasing a threshold amount of photocurrent that is integrated per integrated charge unit generated by the integration circuit. In this regard, one or more operating parameters may be adjusted so as to reduce the number of integrated charge units generated by the integration circuit within a period of time given a level of light detected by the photodetection circuit in an instance in which the counter value exceeds the threshold voltage. The method may then return to operation 1400, and the photodetection circuit may be operated in linear mode using the adjusted operating parameter(s) for the integration circuit.

In some example embodiments, operation 1420 may further include determining if the counter value has exceeded the defined threshold value a threshold number of times. For example, if the counter has overflowed threshold number, n, times, then one or more operating parameters of the integration circuit may be adjusted in operation 1430. If, however, the counter has not yet overflowed n times, then the operating parameters of the integration circuit may remain unchanged.

In some example embodiments, if less than a threshold amount of light is detected in linear mode (e.g., if the counter value is less than a certain threshold), then the operating mode of a photodetection circuit may be switched to Geiger mode. For example, in some embodiments, if a counter value read in linear mode is zero or is zero a threshold consecutive number of times, the operating mode of the photodetection circuit may be switched to Geiger mode. If the operating mode of a photodetection circuit is switched from linear mode to Geiger mode, operation of the photodetection circuit can, for example, proceed with operation 1300.

Figure 15:
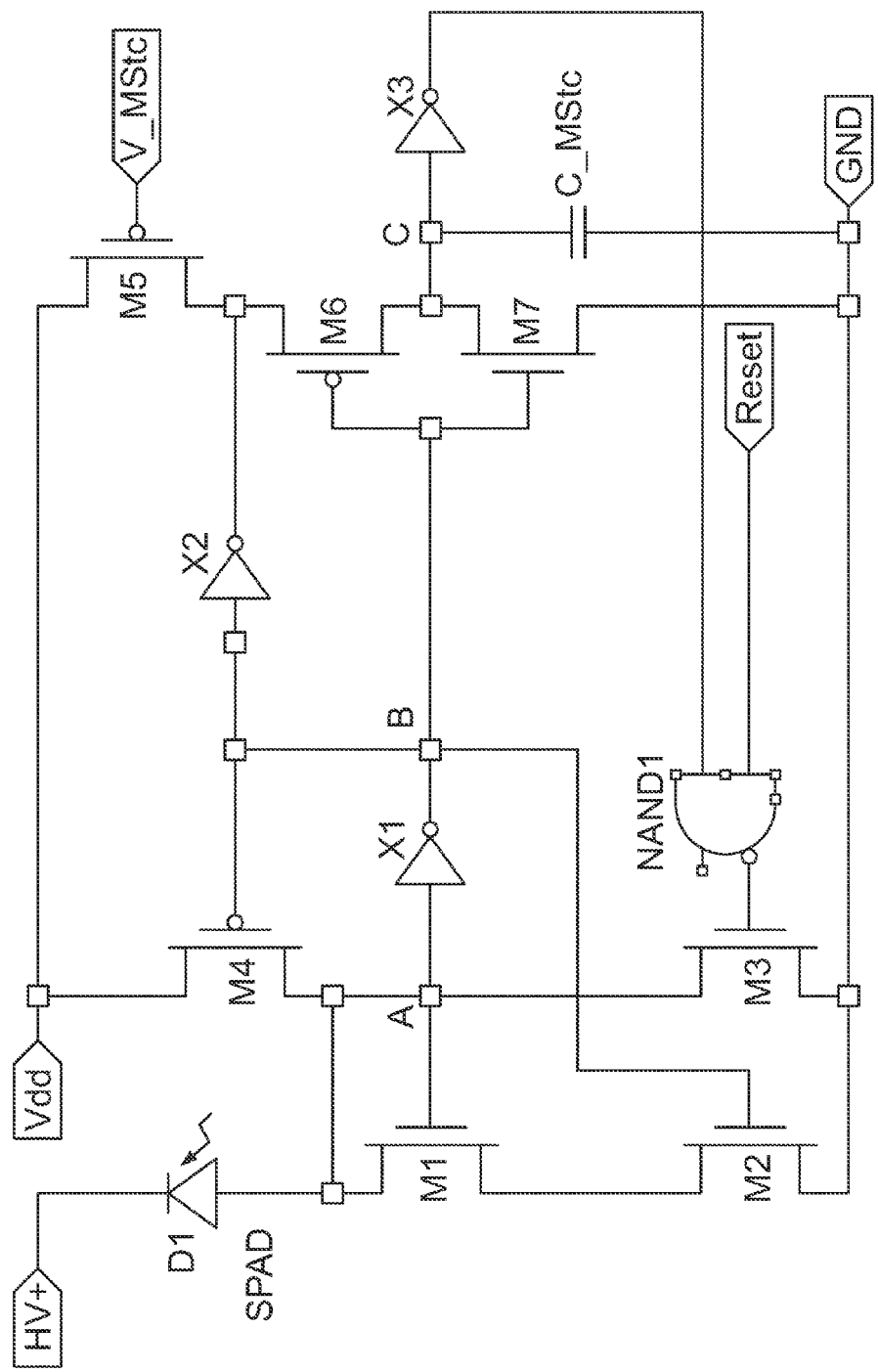
FIG. 15 illustrates another example circuit that may be used to provide an active quenching circuit that may be used in a photodetection circuit in accordance with some example embodiments.

FIG. 15 illustrates another example circuit that may be used to provide an active quenching circuit that may be used in a photodetection circuit, such as photodetection circuit 102, in accordance with some example embodiments. The active quenching circuit of FIG. 15 may be initialized by setting Reset signal to logic 0. Setting the Reset signal to 0 may also initialize the SPAD (D1), which can be an embodiment of the avalanche photodiode 102, by pulling node A to GND using transistor M3, while transistor M4 is off and node B is at logic 1 and node C is at logic 0. The presence of a photon and the ensuing avalanche may create a current in the SPAD that pulls up node A, thereby developing a voltage across the diode connected transistor M1, which may be sensed by inverting amplifier X1. Once the threshold is reached the amplifier output (node B) may be driven to GND turning on transistor M4 that amplifies the rate of switching of inverting amplifier X1. With the output of amplifier X1 driven to GND transistor M2 may be turned off, thus interrupting the current path to the SPAD diode D1 and hence quenching the avalanche. With node B at GND, capacitor C_MStc may begin to charge up at a rate determined by the current in the starved inverter comprised of transistors M6 and M7. The starving current and hence the rate of capacitor charge may be determined by the bias voltage V_MStc on the gate of transistor M5. This bias voltage may determine the bias constant of the circuit, which is essentially a monostable logic circuit. Once the voltage on C reaches the threshold of the inverting amplifier X3, the inverting amplifier X3 creates a short reset pulse that biases transistor M3 high through the NAND gate (NAND 1), thereby readying the SPAD ready to detect a new photon. The inverting amplifiers X1 and X3 can each be implemented via a simple inverter or another high gain amplifier. Transistors M1 and M2 may be sized appropriately (larger width) to improve matching and to enable small avalanche currents to create a large voltage at node A It will be understood that each block of the flowcharts in FIGS. 12-14, and combinations of blocks in the flowcharts, may be implemented by various means, such as hardware and/or a computer program product comprising one or more computer-readable mediums having computer readable program instructions stored thereon. For example, one or more of the procedures described herein may be embodied by computer program instructions of a computer program product. In this regard, the computer program product(s) which may embody the procedures described herein may be stored by one or more memory devices of a mobile terminal, server, or other computing device and executed by a processor in the computing device. In some embodiments, the computer program instructions comprising the computer program product(s) which embody the procedures described above may be stored by memory devices of a plurality of computing devices. As will be appreciated, any such computer program product may be loaded onto a computer or other programmable apparatus to produce a machine, such that the computer program product including the instructions which execute on the computer or other programmable apparatus creates means for implementing the functions specified in the flowchart block(s). Further, the computer program product may comprise one or more computer-readable memories on which the computer program instructions may be stored such that the one or more computer-readable memories can direct a computer or other programmable apparatus to function in a particular manner, such that the computer program product comprises an article of manufacture which implements the function specified in the flowchart block(s). The computer program instructions of one or more computer program products may also be loaded onto a computer or other programmable apparatus to cause a series of operations to be performed on the computer or other programmable apparatus to produce a computer-implemented process such that the instructions which execute on the computer or other programmable apparatus implement the functions specified in the flowchart block(s). Accordingly, blocks of the flowcharts support combinations of means for performing the specified functions. It will also be understood that one or more blocks of the flowcharts, and combinations of blocks in the flowcharts, may be implemented by special purpose hardware-based computer systems which perform the specified functions, or combinations of special purpose hardware and computer program product(s).

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

The embodiments can also be embodied as computer readable code on a computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

The foregoing description, for the purpose of explanation, has been described with reference to specific example embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A photodetection circuit configured to selectively operate in either linear mode or Geiger mode, the photodetection circuit comprising:
   an avalanche photodiode;
   a mode switching circuit configured to selectively switch an operating mode of the photodetection circuit between linear mode and Geiger mode by modifying a bias voltage applied to the avalanche photodiode during operation of the photodetection circuit;
   a quenching circuit configured to quench and reset the avalanche photodiode in response to an avalanche event when the photodetection circuit is operated in Geiger mode;
   an integration circuit configured to integrate photocurrent output by the avalanche photodiode and generate integrated charge units based at least in part on the integrated photocurrent when the photodetection circuit is operated in linear mode; and
   at least one counter, wherein:
   the at least one counter is configured to count pulses output by the avalanche photodiode in response to photon impact events when the photodetection circuit is operated in Geiger mode, and
   the at least one counter is configured to count integrated charge units generated by the integration circuit when the photodetection circuit is operated in linear mode.

2. The photodetection circuit of claim 1, further configured to selectively operate in one of the linear mode, the Geiger mode, and a time-of-flight measurement mode, wherein
   the mode switching circuit is configured to selectively switch the operating mode of the photodetection circuit between linear mode, Geiger mode, and time-of-flight measurement mode by modifying the bias voltage applied to the avalanche photodiode during operation of the photodetection circuit,
   the quenching circuit is configured to quench and reset the avalanche photodiode in response to an avalanche event when the photodetection circuit is operated in Geiger mode and time-of-flight measurement mode, and the at least one counter is configured to count pulses output by the avalanche photodiode in response to photon impact events when the photodetection circuit is operated in Geiger mode and time-of-flight measurement mode.

3. The photodetection circuit of claim 1, wherein the photodetection circuit is implemented on a three-dimensional structure comprised of a plurality of tiers, the avalanche photodiode, the quenching circuit, the integration circuit, and the at least one counter being distributed among the plurality of tiers.

4. The photodetection circuit of claim 3, wherein the avalanche photodiode of the first tier and the quenching circuit, integration circuit, and the at least one counter of the second tier all comprise complementary metal-oxide-semiconductor (CMOS) circuitry.

5. The photodetection circuit of claim 1, wherein the quenching circuit comprises an active quenching circuit, the active quenching circuit configured, in response to sensing an avalanche event, to:

lower a reverse bias voltage applied to the avalanche photodiode; and following a delay period, raise the bias voltage above a breakdown voltage associated with the avalanche photodiode to reset the avalanche photodiode.

6. The photodetection circuit of claim 1, wherein the quenching circuit comprises a passive quenching circuit.

7. The photodetection circuit of claim 1, wherein the integration circuit comprises a sigma-delta modulation circuit.

8. The photodetection circuit of claim 1, wherein the mode switching circuit is configured to:

apply a first bias voltage to the avalanche photodiode to operate the photodetection circuit in Geiger mode, the first bias voltage exceeding a breakdown voltage associated with the avalanche photodiode; and apply a second bias voltage to the avalanche photodiode to operate the photodetection circuit in linear mode, the second bias voltage being less than the breakdown voltage.

9. The photodetection circuit of claim 1, wherein the mode switching circuit is configured to selectively switch the operation mode of the photodetection circuit in response to a control signal generated externally to the photodetection circuit.

10. The photodetection circuit of claim 1, wherein the mode switching circuit is configured to selectively switch the operation mode of the photodetection circuit in response to a control signal generated within the photodetection circuit.

11. The photodetection circuit of claim 1, wherein the photodetection circuit further comprises:

a plurality of avalanche photodiodes;
a plurality of quenching circuits; and
a plurality of integration circuits;
wherein each of the plurality of avalanche diodes is coupled with a respective one of the plurality of quenching circuits and a respective one of the plurality of integration circuits;
wherein the at least one counter is configured to count pulses output by the avalanche photodiodes in response to photon impact events when the photodetection circuit is operated in Geiger mode; and
wherein the at least one counter is configured to count integrated charge units generated by the integration circuits when the photodetection circuit is operated in linear mode.

12. The photodetection circuit of claim 1, wherein the photodetection circuit is embodied on a camera device, the photodetection circuit being configured to sense at least a portion of an image for capture by the camera device.

13. A method of operating a photodetection circuit configured to selectively operate in either linear mode or Geiger mode, the method comprising:

operating the photodetection circuit in one of linear mode or Geiger mode;

reading a counter value generated based at least in part on an amount of light detected by the photodetection circuit;

determining if the counter value has exceeded a defined threshold value; and if it is determined that the counter value has exceeded the defined threshold value:

switching from Geiger mode to linear mode if the photodetection circuit is being operated in Geiger mode; and adjusting an operating parameter of an integration circuit used to integrate photocurrent if the photodetection circuit is being operated in linear mode.

14. The method of claim 13, wherein the defined threshold value is a counter overflow of a counter used to maintain the counter value.

15. The method of claim 13, wherein adjusting the operating parameter of the integration circuit comprises adjusting an integration time threshold.

16. The method of claim 13, wherein adjusting the operating parameter of the integration circuit comprises increasing a threshold amount of photocurrent that is integrated per integrated charge unit generated by the integration circuit.

17. The method of claim 13, wherein when the photodetection circuit is operated in Geiger mode, the counter value comprises a count of photon impact events detected by the photodetection circuit.

18. The method of claim 13, wherein when the photodetection circuit is operated in linear mode, the counter value comprises a count of integrated charge units generated by the integration circuit based at least in part on integrated photocurrent produced from light detected by the photodetection circuit.

19. The method of claim 13, wherein switching from Geiger mode to linear mode comprises adjusting a bias voltage applied to an avalanche photodiode of the photodetection circuit.

20. The method of claim 13, further comprising actively quenching and resetting an avalanche photodiode implemented on the photodetection circuit in response to an avalanche event when the photodetection circuit is operated in Geiger mode.

21. The method of claim 13, further comprising:
detecting an ambient light condition;
selecting one of Geiger mode or linear mode as an initial mode of operation of the photodetection circuit based at least in part on the detected ambient light condition.

* * * * *